(12) United States Patent
Lee et al.

(10) Patent No.: US 7,206,457 B2
(45) Date of Patent: Apr. 17, 2007

(54) METHOD AND APPARATUS FOR ENCODING AND DECODING KEY VALUE DATA OF COORDINATE INTERPOLATOR

(75) Inventors: Shin-jun Lee, Seoul (KR); Seok-yoon Jung, Seoul (KR); Euee-seon Jang, Seoul (KR); Sang-oak Woo, Kyungki-do (KR); Mahn-jin Han, Kyungki-do (KR); Do-kyoon Kim, Kyungki-do (KR); Gyeong-ja Jang, Kyungki-do (KR)

(73) Assignee: Samsung Electronics Co., Ltd., Suwon, Kyungki-do (KR)

( * ) Notice: Subject to any disclaimer, the term of this patent is extended or adjusted under 35 U.S.C. 154(b) by 606 days.

(21) Appl. No.: 10/305,011

(22) Filed: Nov. 27, 2002

(65) Prior Publication Data

US 2003/0128884 A1 Jul. 10, 2003

Related U.S. Application Data

(60) Provisional application No. 60/369,597, filed on Apr. 4, 2002, provisional application No. 60/342,101, filed on Dec. 26, 2001, provisional application No. 60/334,541, filed on Dec. 3, 2001, provisional application No. 60/333,130, filed on Nov. 27, 2001.

(30) Foreign Application Priority Data

Oct. 18, 2002 (KR) ...................... 10-2002-0063852

(51) Int. Cl.
*G06K 9/36* (2006.01)
*G06K 9/46* (2006.01)
(52) U.S. Cl. ...................... 382/243; 382/238
(58) Field of Classification Search ................ 382/236
See application file for complete search history.

(56) References Cited

U.S. PATENT DOCUMENTS 6,075,901 A 6/2000 Signes et al.

(Continued)

FOREIGN PATENT DOCUMENTS

EP 02 25 8133 4/2005

(Continued)

OTHER PUBLICATIONS

J. Yang, C. Kim, S. Lee, "Compression of 3d Triangle Mesh Sequences", Multimedia Signal Processing, 2001 IEEE Fourth Workshop on; Oct. 3-5, 2001, pp. 181-186.*

(Continued)

*Primary Examiner*—Wenpeng Chen
*Assistant Examiner*—Yuzhen Ge
(74) *Attorney, Agent, or Firm*—Buchanan Ingersoll & Rooney PC

(57) ABSTRACT

A method and an apparatus for encoding/decoding key value data of a coordinate interpolator used in a three-dimensional graphic animation are provided. The apparatus for encoding key value data of a coordinate interpolator representing the position of each vertex of an object using coordinates of each of the vertices including x, y, and z components includes a quantizer, which quantizes a coordinate interpolator input there into with predetermined quantization bits, a DPCM processor, which performs a DPCM operation of a predetermined mode on each component of each vertex of the quantized coordinate interpolator and generates differential data based on the temporal variation of the coordinates of each of the vertices and differential data based on the spatial variation of the coordinates of each of the vertices.

49 Claims, 34 Drawing Sheets

U.S. PATENT DOCUMENTS

| | | | |
|---|---|---|---|
| 6,204,854 B1* | 3/2001 | Signes et al. ............... | 345/427 |
| 6,529,086 B2* | 3/2003 | Kim et al. .................. | 332/106 |
| 6,549,206 B1* | 4/2003 | Signes ........................ | 345/473 |
| 6,693,645 B2* | 2/2004 | Bourges-Sevenier ........ | 345/619 |
| 2002/0036639 A1* | 3/2002 | Bourges-Sevenier ........ | 345/474 |
| 2002/0097246 A1* | 7/2002 | Jang et al. .................. | 345/474 |
| 2003/0103572 A1 | 6/2003 | Lee et al. | |
| 2003/0103573 A1 | 6/2003 | Woo et al. | |
| 2003/0108107 A1 | 6/2003 | Kim et al. | |
| 2003/0128215 A1 | 7/2003 | Kim et al. | |
| 2003/0147470 A1 | 8/2003 | Lee et al. | |

FOREIGN PATENT DOCUMENTS

WO     WO 01/41156 A1     6/2001

OTHER PUBLICATIONS

European Search Report issued by the European Patent Office on Apr. 15, 2005 in corresponding Application No. EP 02 25 8133.

Kim et al., "Animation Data Compression in MPEG-4:Interpolators", Proceedings 2002 International Conference on Image Processing, Sep. 22-25, 2002, pp. 33-36, vol. 2 of 3, ICIP 2002, Rochester, NY.

Yang et al., "Compression of 3-D Triangle Mesh Sequences Based on Vertex-Wise Motion Vector Prediction", IEEE Transactions on Circuits and Systems for Video Technology, Dec. 2002, vol. 12, No. 12, pp. 1178-1184, New York.

Ahn et al., "Motion-compensated compression of 3D animation models", Electronics Letters, IEE Stevenage, Nov. 22, 2001, vol. 37, No. 24, Great Britain.

Hant et al., "InterpolatorCompression Core Experiments Description N4364", On-line document, Jul. 2001, Sydney.

"Call for Proposals for Interpolator Compression", MPEG, On-line document, Mar. 2001, pp. 1-13, Singapore.

Varakliotis et al., "Coding of Animated 3-D Wireframe Models for Internet Streaming Applications", IEEE International Conference on Multimedia and Expo, Aug. 2001, pp. 237-240, IEEE, Piscataway, NJ.

Jang, "3D Animation Coding: its History and Framework", Abstract, IEEE International Conference, Jul. 30-Aug. 2, 2000, pp. 1119-1122, IEEE, Piscataway, NJ.

Information technology—Coding of audio-visual objects, Part 1: Systems, 1999, cover page, p. 137, p. 245, ISO/IEC, Switzerland.

Signes, "Binary Format for Scene (BIFS): Combining MPEG-4 media to build rich multimedia services", Abstract, Proceedings of the SPIE, Jan. 25, 1999, vol. 3653, p. 1506 and p. 1517, SPIE, Bellingham, Virginia.

Zhen et al., "Lossless Compression of DSA Image Sequence Based on $D^2PCM$ Coder", Abstract, Biomedical Engineering Institute, Jun. 1999.

Search Report issued by the European Patent Office on Aug. 22, 2005 in corresponding Application No. EP 05 07 6128.

Kim et al., "Technical Description of Interpolator Compression Tools", XP-001152010, URL:http//www.epoline.org/dossier/EP02258133>, Mar. 2002.

Kim et al., Bitstream syntax and Decoding process of interpolator compression and it's apparatus (Interpolator Compression part of the AFX study document), XP-001152011, URL:http://www.epoline.org/dossier/EP02258133>, Aug. 10, 2005.

Kim et al., "Result of Core Experiment on Interpolator Compression MPEG01/M7774 Version 1", XP-001152012, URL:http://www.epoline.org/dossier/EP02258133>, Aug. 10, 2005.

Kim et al., "Result of Core Experiment on Interpolator Compression MPEG01/M7774 Version 2", XP-001152013, URL:http://www.epoline.org/dossier/EPO2258133>, Aug. 10, 2005.

* cited by examiner

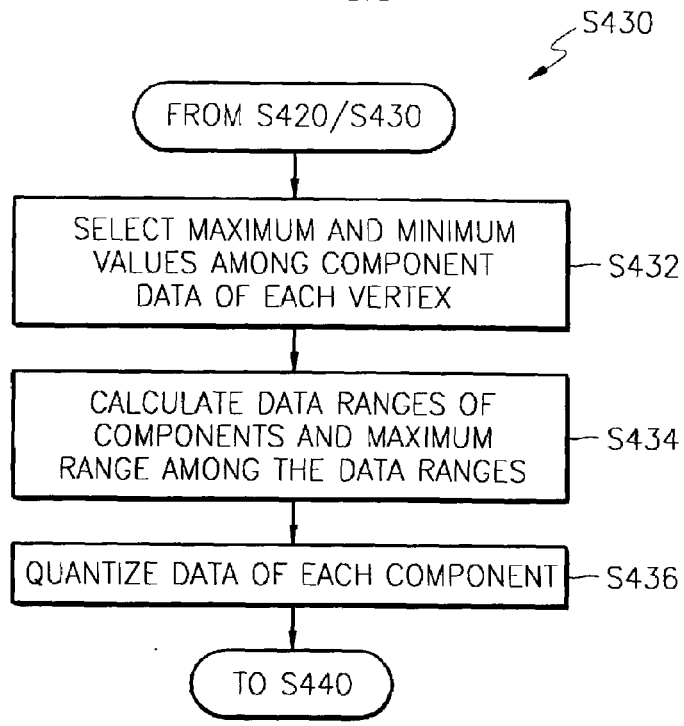
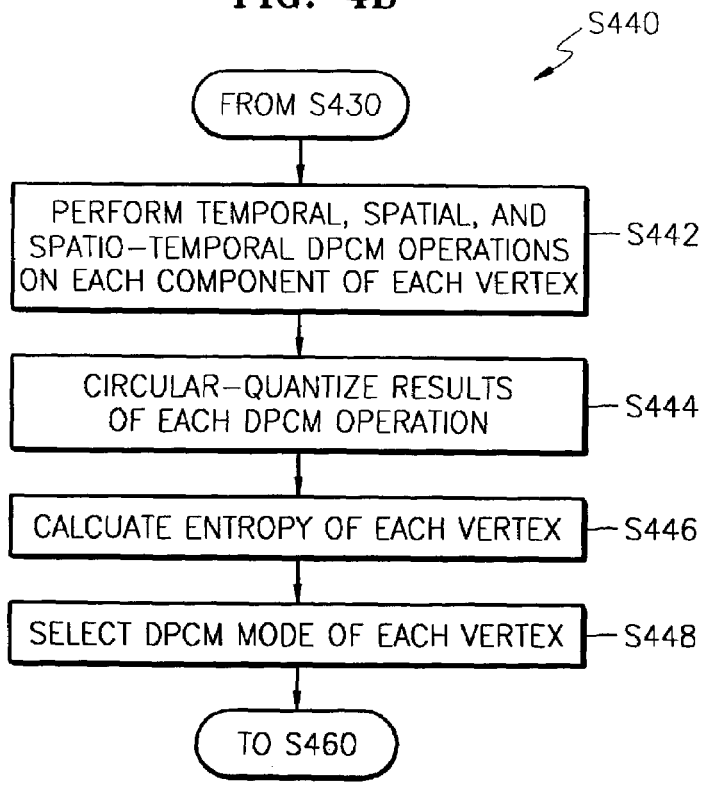

FIG. 12

```
class CompressedCoordinateInterpolator {
        CoordIKeyValueHeader coordIKVHeader.
        qf_start(),
        aligned(8)        CoordIKeyValue coordIKeyValue(coordIKVHeader);
}
```

FIG. 13

```
class CoordIKeyValueHeader {
        bit(1) bTranspose;
        unsigned int(5) nKVQBit;
        unsigned int(5) nCoordQBit;
        unsigned int(nCoordQBit) nNumberOfCoord;
        unsigned int(4) nKVDigit.
        KeyValueMinMax kVMinMax (nKVDigit);
        unsigned int(nKVQBit) nXQMinOfMin;
        unsigned int(nKVQBit) nXQMinOfMax;
        unsigned int(nKVQBit) nYQMinOfMin;
        unsigned int(nKVQBit) nYQMinOfMax;
        unsigned int(nKVQBit) nZQMinOfMin;
        unsigned int(nKVQBit) nZQMinOfMax;
        unsigned int(nKVQBit) nXQMaxOfMin;
        unsigned int(nKVQBit) nXQMaxOfMax;
        unsigned int(nKVQBit) nYQMaxOfMin;
        unsigned int(nKVQBit) nYQMaxOfMax;
        unsigned int(nKVQBit) nZQMaxOfMin;
        unsigned int(nKVQBit) nZQMaxOfMax;
        unsigned int(5) nNumKeyCodingBit;
        unsigned int(nNumKeyCodingBit) nNumberOfKey;
}
```

FIG. 14A

```
class CoordIKeyValue (CoordIKeyValueHeader coordIKVHeader) {
        int j, c;
    if(coordIKVHeader.bTranspose == 1) {
        int temp = coordIKVHeader.nNumberOfKey;
        coordIKVHeader.nNumberOfKey = coordIKVHeader.nNumberOfCoord;
        coordIKVHeader.nNumberOfCoord = temp;
    }
        int nKVACodingBitQBit = (int)(log10(abs(coordIKVHeader.nKVQBit))/log10(2))+1;
        int nDPCMMode[coordIKVHeader.nNumberOfCoord][3];
        unsigned int bSelFlag[coordIKVHeader.nNumberOfCoord][3] = 1;
        CoordIDPCMMode coordIDPCMMode(coordIKVHeader);
        for(j = 0; j < coordIKVHeader.nNumberOfCoord; j++) { }
```

FIG. 14B

```
for(j = 0; j < coordIKVHeader.nNumberOfCoord; j++) {
        for(c = 0; c < 3; c++) {
                if(c == 0) {
                        if(coordIKVHeader.nXQMaxOfmin <= coordIKVHeader.nXQMinOfmax) {
                                qf_decode(&bSelFlag[j][c], selectionFlagContext).
                        }
                }
                else if(c == 1) {
                        if(coordIKVHeader.nYQMaxOfmin <= coordIKVHeader.nYQMinOfmax) {
                                qf_decode(&bSelFlag[j][c], selectionFlagContext);
                        }
                }
                else if(c == 2) {
                        if(coordIKVHeader.nZQMaxOfmin <= coordIKVHeader.nZQMinOfmax) {
                                qf_decode(&bSelFlag[j][c], selectionFlagContext).
                        }
                }
                if(bSelFlag[j][c] == 1) {
                        if(c == 0)
                                decodeUnsignedAAC(&nKVACodingBit[j][c], nKVACodingBitQBit,
aqpXContext);
                        else if(c == 1)
                                decodeUnsignedAAC(&nKVACodingBit[j][c], nKVACodingBitQBit,
aqpYContext);
                        else if(c == 2)
                                decodeUnsignedAAC(&nKVACodingBit[j][c], nKVACodingBitQBit,
aqpZContext);
                        if(j > 0) {
                                if(nDPCMMode[j][c] == 2 || nDPCMMode[j][c] == 3) {
                                        int nQBitOfRef = (int)(log10(abs(j-1))/log10(2))+1;
                                        decodeUnsignedAAC(&nRefVertex[j][c], nQBitOfRef,
refContext);
                                }
                        }
                        if(nKVACodingBit[j][c] != 0) {
                                decodeSignedAAC(&nQMin[j][c], coordIKVHeader.nKVQBit+1,
                                        qMinSignContext, qMinContext);
                                decodeSignedAAC(&nQMax[j][c], coordIKVHeader.nKVQBit+1,
                                                qMaxSignContext, qMaxContext);
                        }
                } else
                        decodeSignedAAC(&nQMin[j][c], coordIKVHeader.nKVQBit+1,
                                qMinSignContext, qMinContext);

CoordIKeyValueDic coordIKeyValueDic(bSelFlag[j][c],
                        KVACodingBit[j][c], coordIKVHeader.nNumberOfKey, c);
                }
        }
}
```

FIG. 15

```
class CoordIDPCMMode (CoordIKeyValueHeader coordIKVHeader) {
        int i, s, k;
        unsigned int bIndexDPCMMode[coordIKVHeader.nNumberOfCoord] = 0;
        int nNumberOfSymbol = 0;
        for(i = 0; i < 27; i++) {
                qf_decode(&bAddressOfDPCMMode[i], dpcmModeDicAddressContext);
                if(bAddressOfDPCMMode[i] == 1)
                        nNumberOfSymbol++;
        }
        for(s = 0; s < nNumberOfSymbol; s++) {
                for(k = 1; k < coordIKVHeader.nNumberOfCoord; k++) {
                        if(bIndexDPCMMode[k] == 0) {
                                qf_decode(&bDPCMIndex, dpcmModeDicIndexContext);
                                if(bDPCMIndex == 1)
                                        bIndexDPCMMode[k] = 1;
                        }
                }
        }
}
```

FIG. 16

```
class CoordIKeyValueDic (unsigned int bSelFlag, unsigned int nKVCodingBit, int nNumberOfKey, int c) {
        if(bSelFlag == 1 && nKVCodingBit != 0) {
                qf_decode(&nDicModeSelect, dicModeSelectionContext);
                if(nDicModeSelect == 1)
                        CoordIIncrementalMode coordIIncrementalMode(nKVCodingBit, nNumberOfKey);
                else
                        CoordIOccurrenceMode coordIOccurrenceMode(nKVCodingBit, nNumberOfKey, c);
        }
}
```

FIG. 17

```
class CoordIIncrementalMode (unsigned int nKVCodingBit, int nNumberOfKey) {
    int i, s, k;
    int nSizeOfAddress = (2^ nKVCodingBit+1)-1;
    unsigned int bAddrIndex[nNumberOfKey] = 0;
    int nNumberOfSymbol = 0;
    for(i = 0; i < nSizeOfAddress; i++) {
        qf_decode(&bAddress[i], dicAddressContext);
        if(bAddress[i] == 1) {
            nNumberOfSymbol++;
        }
    }
    for(s = 0; s < nNumberOfSymbol; s++) {
        qf_decode(&nTrueOne, dicOneContext);
        for(k = 0; k < nNumberOfKey; k++) {
            if(bIndexOfAddr[k] == 0) {
                qf_decode(&bAddrIndex, dicIndexContext);
                if(bAddrIndex == nTrueOne) {
                    bAddrIndex[k] = 1;
                }
            }
        }
    }
}
```

FIG. 18

```
class CoordIOccurrenceMode (unsigned int nKVCodingBit, int nNumberOfKey, int c) {
        int i, k;
        unsigned int bIndexOfDic[nNumberOfKey] = 0;
        for(i = 0; i < nNumberOfKey; i++) {
                if(bIndexOfDic[i] == 0) {
                        bIndexOfDic[nNumberOfKey] = 1;
                        if(c == 0)
                                decodeSignedQuasiAAC(&nQKV[i], nKVCodingBit+1,
                                        kvSignContext, kvXContext);
                        else if(c == 1)
                                decodeSignedQuasiAAC(&nQKV[i], nKVCodingBit+1,
                                        kvSignContext, kvYContext);
                        else if(c == 2)
                                decodeSignedQuasiAAC(&nQKV[i], nKVCodingBit+1,
                                        kvSignContext, kvZContext);
                        qf_decode(&bSoleKV, dicSoleKVContext);
                        if(bSoleKV == 0) {
                                qf_decode(&nTrueOne, dicOneContext);
                                for(k = i+1; k < nNumberOfKey; k++) {
                                        if(bIndexOfDic[k] == 0) {
                                                int bDicIndex;
                                                qf_decode(&bDicIndex, dicIndexContext);
                                                if(bDicIndex == nTrueOne)
                                                        bIndexOfDic[k] = 1;
                                        }
                                }
                        }
                }
        }
}
```

FIG. 19

```
void decodeSignedQuasiAAC(int *nDecodedValue, int qstep, QState *signContext, QState
*valueContext)
{
        int b = qstep - 2;
        int msb = 0;
        do {
                qf_decode(&msb, &valueContext[b]);
                msb = msb << b;
                b--;
        } while (msb == 0 && b >= 0);
        int sgn = 0;
        int rest = 0;
        if(msb != 0) {
                qf_decode(&sgn, signContext);
                while (b >= 0) {
                        int temp = 0;
                        qf_decode(&temp, zeroContext);
                        rest |= (temp << b);
                        b--;
                }
        }
        if(sgn)
                *nDecodedValue = -(msb+rest);
        else
                *nDecodedValue = (msb+rest);
}
```

FIG. 20B
(a)          (b)          (c)
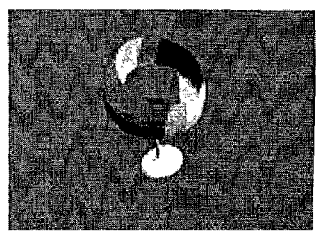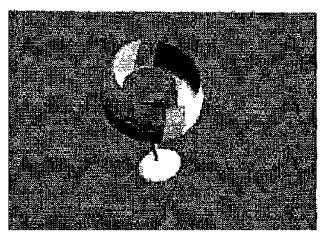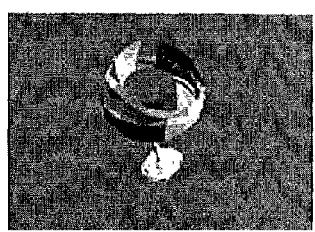

METHOD AND APPARATUS FOR ENCODING AND DECODING KEY VALUE DATA OF COORDINATE INTERPOLATOR

This application claims the priority of Korean Patent Application No. 2002-63852, filed Oct. 18, 2002, in the Korean Intellectual Property Office. This application also claims the benefit of U.S. Provisional Application No. 60/333,130, filed Nov. 27, 2001; U.S. Provisional Application No. 60/334,541, filed Dec. 3, 2001; U.S. Provisional Application No. 60/342,101, filed Dec. 26, 2001; and U.S. Provisional Application No. 60/369,597, filed Apr. 4, 2002. The entire contents of these applications are incorporated herein by reference.

BACKGROUND OF THE INVENTION

1. Field of the Invention

The present invention relates to an apparatus and a method for encoding and decoding synthesized images, and more particularly, to an apparatus and a method for encoding and decoding key value data of a coordinate interpolator representing the location of an object using coordinates of a vertex consisting of x, y, and z components in a keyframe-based graphic animation.

2. Description of the Related Art

Three-dimensional (3D) animation techniques have been widely adopted in 3D computer games or virtual reality computer applications. Virtual reality modeling language (VRML) is a representative example of such 3D animation techniques.

International multimedia standards, such as MPEG-4 binary format for scene (BIFS) and virtual reality modeling language (VRML), support a keyframe-based 3D animation using an interpolator node. In MPEG-4 BIFS and VRML, there are various kinds of interpolators including a scalar interpolator, a position interpolator, a coordinate interpolator, a orientation interpolator, a normal line interpolator, and a color interpolator, and these interpolators and their functions and characteristics are shown in Table 1.

TABLE 1

| Interpolator | Characteristics | Function |
| --- | --- | --- |
| Scalar interpolator | Linear interpolation of scalar variations | Capable of representing area, diameter, and intensity |
| Position interpolator | Linear interpolation on 3D coordinates | Parallel movement in 3D space |
| Orientation interpolator | Linear interpolation of 3D coordinate axis and amount of rotation | Rotation in 3D space |
| Coordinate interpolator | Linear interpolation of variations in 3D coordinates | 3D morphing |
| Normal line interpolator | Linear interpolation of 3D coordinates of normal line | Capable of representing variations in 3D vector of normal line |
| Color interpolator | Linear interpolation of color information | Capable of representing variations in color |

Among the interpolators shown in Table 1, the coordinate interpolator is used to represent information on the location of each vertex constituting a 3D object in a keyframe-based animation and are comprised of keys and key value fields. Key fields represent the position of each keyframe on a temporal axis using discontinuous numbers in a range between $-\infty$ and $\infty$. Each of the Key value fields specifies information on the position of each of the vertices constituting a 3D object at a certain moment represented by each of the keys and consists of three components x, y, and z. Each of the key value fields includes as many key values as each of the key fields has. In such a keyframe-based animation, predetermined keyframes are located at arbitrary places on a temporal axis, and animation data between keyframes are filled by linear interpolation.

Since linear interpolation is employed in MPEG-4 BIFS and VRML, a considerable amount of key data and key value data is required to represent an animation as naturally and smoothly as possible using linear interpolators. In addition, in order to store and transmit such a natural and smooth animation, a storage of a large capacity and a considerable amount of time are needed. Therefore, it is preferable to compress interpolators in order to make it easier to store and transmit the interpolators.

In predictive MF field coding (PMFC), which is one of the methods for encoding and decoding interpolator nodes that have been adopted in MPEG-4 BIFS, key value data of a coordinate interpolator are encoded using a quantizer, a differential pulse code modulation (DPCM) operator, and an entropy encoder, as shown in FIG. 1. Referring to FIG. 1, the quantizer and the DPCM operator removes redundancy of the key value data, and the DPCM operator outputs the results of its operation to the entropy encoder. However, PMFC is not sufficiently effective in encoding key value data because it entropy-encodes only differential data obtained from a general DPCM operation and considers only a spatial correlation between vertices constituting a 3D object in an animation without taking into consideration a temporal correlation between such vertices, which is very important in a keyframe-based animation.

SUMMARY OF THE INVENTION

To solve the above and other problems, it is an aspect of the present invention to provide a method and an apparatus for encoding key value data of a coordinate interpolator considering a temporal correlation between vertices of a 3D object in animation as well as a spatial correlation therebetween.

It is another aspect of the present invention to provide a method and an apparatus for decoding encoded key value data of a coordinate interpolator considering a temporal correlation between vertices of a 3D object in animation as well as a spatial correlation therebetween.

It is another aspect of the present invention to provide a bitstream, into which key value data of a coordinate interpolator are encoded considering a temporal correlation between vertices of a 3D object in animation as well as a spatial correlation therebetween.

It is another aspect of the present invention to provide a method and an apparatus for a DPCM operation which are used in the method and the apparatus for encoding key value data of a coordinate interpolator according to the present invention and perform a DPCM operation on coordinate data of a 3D object considering a temporal correlation between vertices of a 3D object in animation as well as a spatial correlation therebetween.

It is another aspect of the present invention to provide a method and an apparatus for an inverse DPCM operation, which decode differential data generated by the method and the apparatus for a DPCM operation according to the present invention.

Accordingly, to achieve the above and other aspects of the present invention, there is provided an apparatus for encoding key value data of a coordinate interpolator representing the position of each vertex of an object using coordinates of each of the vertices including x, y, and z components. The apparatus includes a quantizer, which quantizes a coordinate interpolator input thereinto with predetermined quantization bits, a DPCM processor, which performs a DPCM operation of a predetermined mode on each component of each vertex of the quantized coordinate interpolator and thus generates differential data based on the temporal variation of the coordinates of each of the vertices and differential data based on the spatial variation of the coordinates of each of the vertices, a dictionary encoder, which generates symbols representing the differential data of each of the components of each of the vertices and the mode of a DPCM operation which has been performed on the differential data and position indexes indicating the positions of the symbols, and an entropy encoder, which entropy-encodes the symbols and the position indexes.

To achieve the above and other aspects of the present invention, there is provided an apparatus for decoding a bitstream, into which key value data of a coordinate interpolator representing the position of each vertex of an object using coordinates of each of the vertices including x, y, and z components are encoded. The apparatus includes an entropy decoder, which generates data to be dictionary-decoded, including symbols of differential data, position indexes indicating the positions of the symbols, and a DPCM operation mode, by entropy-decoding an input bitstream, a dictionary decoder, which generates differential data using the data to be dictionary-decoded, an inverse DPCM processor, which generates quantized data by retrieving differential data between keyframes and differential data between vertices, which are input from the dictionary decoder, following the DPCM operation mode, and an inverse quantizer, which generates retrieved key value data by inverse-quantizing the quantized data.

Preferably, the inverse DPCM processor used in the apparatus for decoding a bitstream includes an inverse temporal DPCM operator, which performs an inverse DPCM operation on differential data between a vertex in one keyframe and the vertex in another keyframe, an inverse spatial DPCM operator, which performs an inverse DPCM operation on differential data between vertices in the same keyframe and their corresponding reference vertex, and an inverse DPCM mode selector, which outputs differential data to the inverse temporal DPCM operator or the inverse spatial DPCM operator depending on the DPCM operation mode.

To achieve the above and other aspects of the present invention, there is provided a method for encoding key value data of a coordinate interpolator representing the position of each vertex of an object using coordinates of each of the vertices including x, y, and z components. The method includes (a) quantizing key value data of a coordinate interpolator with predetermined-quantization bits, (b) performing a DPCM operation of a predetermined mode on each component of each vertex of the quantized coordinate interpolator and thus generating differential data based on the temporal variation of the coordinates of each of the vertices and differential data based on the spatial variation of the coordinates of each of the vertices, (c) generating symbols representing the differential data of each of the components of each of the vertices and the mode of a DPCM operation which has been performed on the differential data and position indexes indicating the positions of the symbols, and (d) entropy-encoding the symbols and the position indexes.

To achieve the above and other aspects of the present invention, there is provided a method for generating differential data between quantized coordinate data of vertices constituting an object moving in time. The method includes performing a temporal DPCM operation, in which differential data between coordinate data of each vertex varying in accordance with the passage of time are generated, performing a spatial DPCM operation, in which differential data between each of the vertices and a reference vertex corresponding to the vertices at a predetermined moment of time are generated, and outputting the smaller ones between the temporal-DPCMed differential data and the spatial-DPCMed differential data.

To achieve the above and other aspects of the present invention, there is provided a method for decoding a bitstream, into which key value data of a coordinate interpolator representing the position of each vertex of an object using coordinates of each of the vertices including x, y, and z components are encoded. The method includes (a) generating data to be dictionary-decoded, including symbols of differential data, position indexes indicating the positions of the symbols, and a DPCM operation mode, by entropy-decoding an input bitstream; (b) generating differential data using the data to be dictionary-decoded by performing a dictionary decoding operation on the symbols of the differential data and the position indexes; (c) generating quantized data by retrieving differential data between keyframes and differential data between vertices following the DPCM operation mode; and (d) generating retrieved key value data by inverse-quantizing the quantized data.

To achieve the above and other aspects of the present invention, there is provided a method for generating quantized coordinate data of vertices constituting an object varying in accordance with the passage of time by performing a predetermined inverse DPCM operation on differential data between coordinate data of vertices. The method includes (a) selecting an inverse DPCM operation to be performed on the differential data depending on a DPCM operation mode included in the differential data; and (b) performing the selected inverse DPCM operation. Here, the selected inverse DPCM operation includes an inverse temporal DPCM operation, in which an inverse DPCM operation is performed on differential data of each vertex varying in accordance with the passage of time, and an inverse spatial DPCM operation, in which an inverse DPCM operation is performed on differential data between each of the vertices and a reference vertex corresponding to the vertices at a predetermined moment of time.

BRIEF DESCRIPTION OF THE DRAWINGS

The above and other advantages of the present invention will become more apparent by describing in detail preferred embodiments thereof with reference to the attached drawings in which:

FIG. 4A is a flowchart of a quantization operation according to a preferred embodiment of the present invention, FIG. 4B is a flowchart of a DPCM operation.

FIG. 1C is a diagram illustrating incremental mode decoding;

FIGS. 12 through 18 are diagrams illustrating examples of bitstream syntax, into which the order of reading bits from a bitstream during decoding according to a preferred embodiment of the present invention is realized;

FIG. 19 is a diagram illustrating an example of program codes by which operations for decoding key value data are realized;

FIGS. 20A and 20B are diagrams for comparing the performance of a method for encoding and decoding key value data of a coordinate interpolator according to the present invention with the performance of a conventional method for encoding and decoding key value data of a coordinate interpolator.

DETAILED DESCRIPTION OF THE INVENTION

Hereinafter, an apparatus for encoding key value data of a coordinate interpolator according to a preferred embodiment of the present invention will be described more fully with reference to the accompanying drawings.

Figure 1:
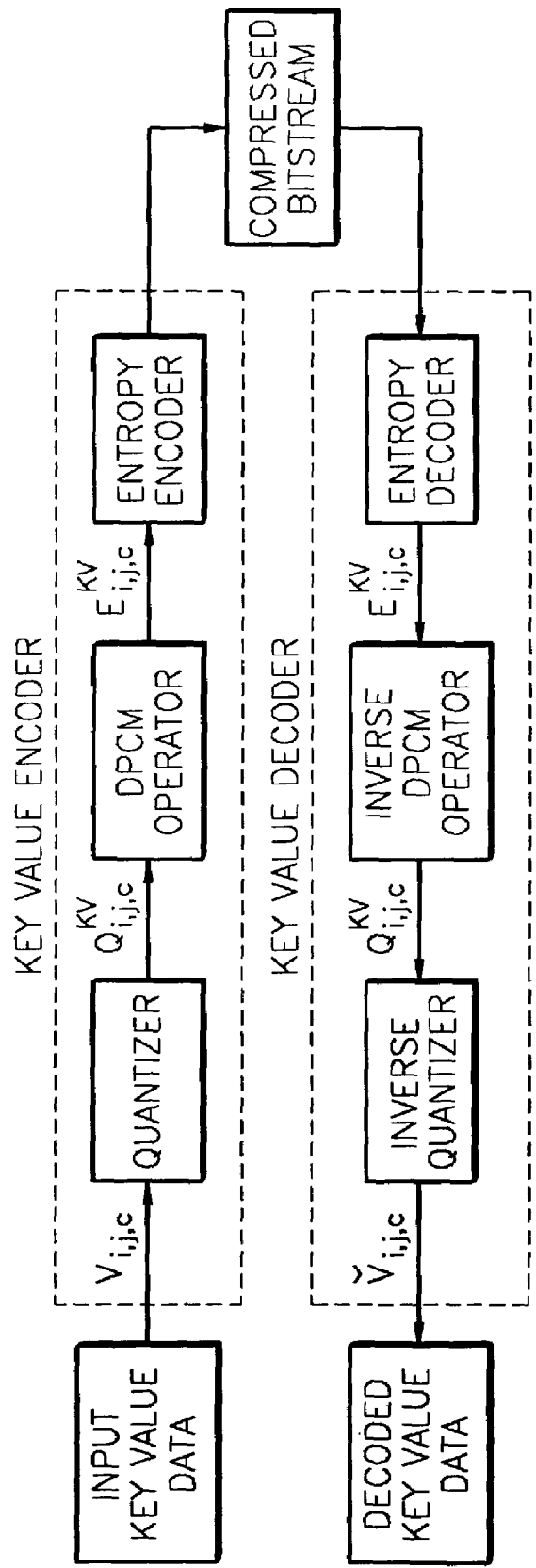
FIG. 1 is a block diagram of conventional apparatuses for encoding key value data of a coordinate interpolator.
Figure 2A:
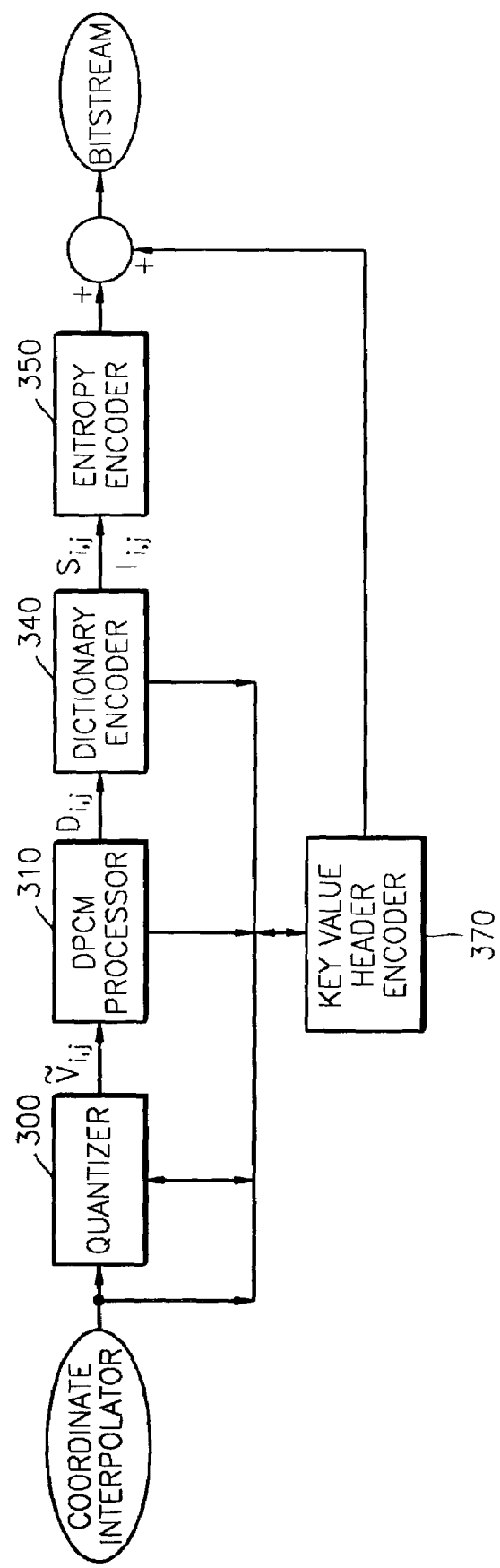
FIG. 2A is a block diagram of an apparatus for encoding key value data of a coordinate interpolator according to a preferred embodiment of the preset invention.
Figure 2B:
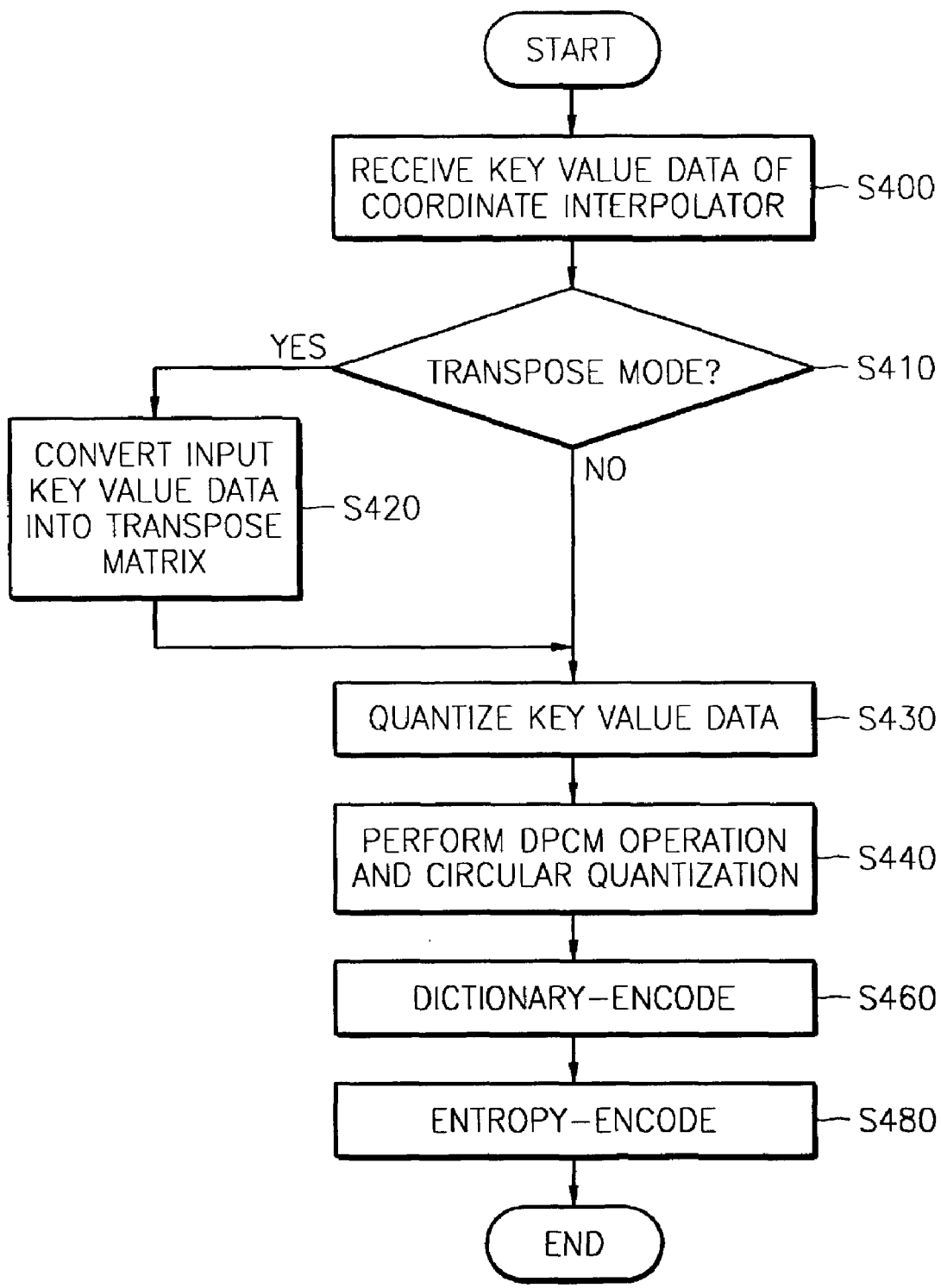
FIG. 2B is a flowchart of a method for encoding key value data of a coordinate interpolator according to a preferred embodiment of the present invention.

FIG. 2A is a block diagram of an apparatus for encoding key value data of a coordinate interpolator according to a preferred embodiment of the present invention, and FIG. 2B is a flowchart of a method for encoding key value data of a coordinate interpolator according to a preferred embodiment of the present invention.

Referring to FIG. 2A, the apparatus for encoding key value data of a coordinate interpolator includes a quantizer 300, which quantizes data of each of the components of each vertex representing key value data of a coordinate interpolator with predetermined quantization bits, a DPCM processor 310, which performs a predetermined DPCM operation on the quantized data of each of the components of each of the vertices, a dictionary encoder 340, which converts differential data into symbols and position indexes, and an entropy encoder 350, which entropy-encodes the symbols and position indexes of the differential data input thereinto.

A method for encoding key value data of a coordinate interpolator will be described in the following with reference to FIG. 2B.

Referring to FIG. 2B, key value data of a coordinate interpolator are input into the quantizer 300 in the form of an N×M matrix in step S400. An example of the input key value data of a coordinate interpolator is shown in the following table.

TABLE 2

| | 1 | 2 | ...j | M |
|---|---|---|---|---|
| 1 | x(1, 1), y(1, 1), z(1, 1) | x(1, 2), y(1, 2), z(1, 2) | | x(1, M), y(1, M), z(1, M) |
| 2 | x(2, 1), y(2, 1), z(2, 1) | x(2, 2), y(2, 2), z(2, 2) | | x(2, M), y(2, M), z(2, M) |
| ... | | | x(i, j), y(i, j), z(i, j) | |
| i | | | | |
| N | x(N, 1), y(N, 1), z(N, 1) | x(N, 2), y(N, 2), z(N, 2) | | x(N, M), y(N, M), z(N, M) |

In Table 2, N represents the number of key data (keyframes), and M represents the number of vertices in each keyframe.

The apparatus for encoding key value data of a coordinate interpolator according to the present invention operates in two different modes for encoding the key value data of a coordinate interpolator. One of the modes is a vertex mode, and the other is a transpose mode. In Table 2, the structure of key value data to be quantized in the quantizer 300 in a vertex mode is shown. Before quantizing the input key value data shown in Table 2, the apparatus for encoding key value data of a coordinate interpolator according to the present invention transposes the input key value data into an M×N matrix. The transposed matrix is inverse-quantized during decoding key value data, and the decoded key value data are converted into N×M matrix so that the same key value data as the input key value data can be retrieved.

Referring to FIG. 2B, the quantizer 300 checks whether the encoding mode of the key value data input from the outside is a transpose mode in step S410. If the encoding mode of the input key value data is a transpose mode, the N×M matrix of the input key value data is transposed into an M×N matrix in step S420.

Thereafter, the quantizer 300 quantizes the data of each of the components in the matrix of the key value data input thereinto with the predetermined quantization bits and outputs the quantized key value data of each of the components to the DPCM processor 310 in step S430. In the same step, the quantizer 300 converts minimum values among the input key value data of each of the components and a maximum range among the data ranges of the components into decimal numbers and outputs the decimal numbers to a key value header encoder 370.

The DPCM processor 310 performs a temporal DPCM operation, a spatial DPCM operation, and a spatio-temporal DPCM operation on the quantized key value data input thereinto, performs a circular quantization operation on the results of the three different DPCM operations, i.e., differential data each obtained from the three DPCM operations, and outputs the differential data having the lowest entropy among them to the dictionary encoder 340 in step S440.

The dictionary encoder 340 generates and outputs dictionary symbols $S_{i,j}$ and position indexes $I_{i,j}$, which correspond to the differential data input from the DPCM processor 310. In particular, the dictionary encoder 340 generates the dictionary symbols and the position indexes, which indicate the mode of the DPCM operation which has been performed on the input differential data, converts the input differential data into symbols or a symbol flag, corresponding to values of the input differential data, and position indexes, representing the positions of the symbols, and outputs the symbols and position indexes to the entropy encoder 350.

The entropy encoder 350 generates a bitstream by entropy-encoding the symbols and position indexes input from the dictionary encoder 340 in step S480.

Hereinafter, steps S400 through S480 will be described more fully with reference to FIGS. 3A through 6C.

Referring to FIG. 4A, the quantizer 300 selects maximum values and minimum values among the data of each of the components in step S432.

The quantizer 300 calculates the data ranges of the components using the maximum and minimum values selected in step S432 and determines a maximum range among the data ranges of the components in step S434.

The quantizer 300 quantizes the key value data of each of the components using the minimum values among the data of each of the components and the maximum range among all the data ranges of the components, which is shown in the following equations.

$$\tilde{V}_{i,j,x} = \text{floor}\left(\frac{V_{i,j,x} - f\text{Min\_X}}{f\text{Max}}(2^{nKVQBit} - 1) + 0.5\right) \quad (1)$$

$$\tilde{V}_{i,j,y} = \text{floor}\left(\frac{V_{i,j,y} - f\text{Min\_Y}}{f\text{Max}}(2^{nKVQBit} - 1) + 0.5\right)$$

$$\tilde{V}_{i,j,z} = \text{floor}\left(\frac{V_{i,j,z} - f\text{Min\_Z}}{f\text{Max}}(2^{nKVQBit} - 1) + 0.5\right)$$

In Equation (1), i represents key data, j represents a vertex, and nKVQBit represents a quantization bit size. In addition, fMin_X, fMin_Y, and fMin_Z represent the minimum values among the data of each of the components, and fMax represents the maximum range among the data ranges of the components.

The quantizer 300 outputs the quantized key value data of each of the components to the DPCM processor 310, converts fMin_X, fMin_Y, fMin_Z, and fMax into decimal numbers, and outputs the decimal numbers to the key value header encoder 370.

A computer stores floating-point numbers as 32-bit binary numbers. In order to reduce the number of bits required for encoding, the quantizer 300 converts fMin_X, fMin_Y, fMin_Z, and fMax into their respective mantissas and exponents in the decimal system, and this process is expressed by the following equation.

$$\underbrace{\text{mantissa\_binary} * 2^{exponent\_binary}}_{\text{the floating-point number in binary system}} = \underbrace{\text{mantissa} * 10^{exponent}}_{\text{the floating-point number in decimal system}} \quad (2)$$

For example, a floating-point number 12.34 can be converted into a binary number by a computer, which is shown in the following.

$$\underset{1}{0} \underset{2}{\underline{10001010111000010100011}} \underset{3}{\underline{10000010}}$$

1: the sign
2: the mantissa in the binary system
3: the exponent in the binary system The binary number can be converted into a decimal number following Equation (2), which is shown in the following.

$$\underset{1}{0} \underset{2}{\underline{1234}} \underset{3}{\underline{2}}$$

1: the sign
2: the mantissa in the decimal system
3: the exponent in the decimal system In order to include a mantissa and an exponent in the decimal system in a bitstream, the quantizer 300 must calculate the numbers of bits required to represent the mantissa and the exponent. The exponent has a value between −38 and 38 and thus can be expressed together with its sign using 7 bits. The number of bits required to represent the mantissa is dependent on the number of digits. The values of the mantissa and the number of bits required to represent the mantissa are shown in the following table.

TABLE 3

| Values of mantissa | Digits of mantissa | Number of bits required |
|---|---|---|
| 0 | 0 | 0 |
| 1–9 | 1 | 4 |
| 10–99 | 2 | 7 |
| 100–999 | 3 | 10 |
| 1000–9999 | 4 | 14 |
| 10000–99999 | 5 | 17 |
| 100000–999999 | 6 | 20 |
| 1000000–9999999 | 7 | 24 |

The quantizer 300 outputs the minimum values fMin_X, fMin_Y, and fMin_Z among the data of each of the components and fMax the maximum range among the data ranges of the components, which have been converted following Equation (2) and Table 3, to the key value header encoder 370.

A DPCM processor and a DPCM operation according to the present invention will be described in the following with reference to FIGS. 3A and 4B.

Figure 3A:
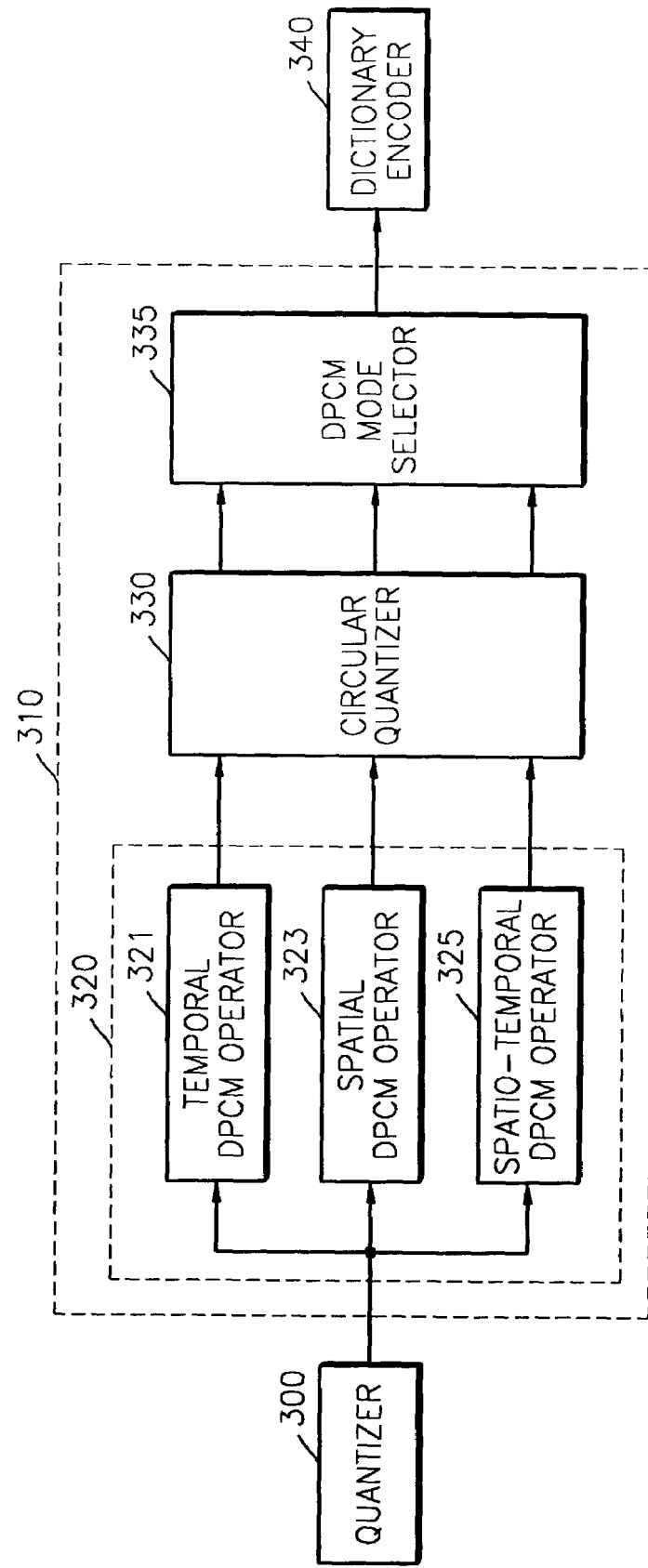
FIG. 3A is a block diagram of a DPCM processor according to a preferred embodiment of the present invention.

FIG. 3A is a block diagram of the DPCM processor 310 according to the present invention. Referring to FIG. 3A, the DPCM processor 310 includes a DPCM operator 320, which performs a temporal DPCM operation, a spatial DPCM operation, and a spatio-temporal DPCM operation on the data of each of the components input from the quantizer 300, a circular quantizer 330, which reduces the range of the differential data input from the DPCM operator 320, and a DPCM mode selector 335, which selects one of the differential data input from the circular quantizer 330. The DPCM operator 320 includes a temporal DPCM operator 321, which performs a temporal DPCM operation on the quantized data of each of the components, a spatial DPCM operator 323, which performs a spatial DPCM operation on the quantized data of each of the components, and a spatio-temporal DPCM operator 325, which performs a spatio-temporal operation on the quantized data of each of the components.

FIG. 4B is a flowchart of a DPCM operation according to a preferred embodiment of the present invention. Referring to FIG. 4B, the quantized data of each of the components are input from the quantizer 300 to the temporal DPCM operator 321, the spatial DPCM operator 323, and the spatio-temporal DPCM operator 325, and then a temporal DPCM operation, a spatial DPCM operation, and a spatio-temporal DPCM operation are performed on the quantized data of each of the components input into their respective operators 321, 323, and 325, in step S442.

The temporal DPCM operator 321 calculates the differences between the component data of vertices in a current keyframe and the component data of vertices in a previous keyframe. A temporal DPCM operation is expressed by the following equation.

$$D_{i,j} = \tilde{V}_{i,j} - \tilde{V}_{i-1,j} \qquad (3)$$

In Equation (3), i represents key data, and j represents the position index of a vertex.

The Spatial DPCM operator 323 calculates the differences between vertices in the same keyframe. In particular, the spatial DPCM operator 323 calculates the entropy of the previous vertices, on which a spatial DPCM operation has been performed prior to the current vertices currently being subjected to a spatial DPCM operation, using the following equation.

$$\text{Entropy}(P) = -\sum_{i=0}^{N-1} P_i \log_2 P_i \qquad (4)$$

In Equation (4), $P_i$ represents the probability that a certain symbol is generated in a vertex and is equal to $$\frac{F_i}{N}$$

where $F_i$ represents how many times the symbol is generated and N represents the number of key data.

The spatial DPCM operator 323 determines a vertex having the lowest entropy among the vertices as a reference vertex and calculates differential data between the data of a vertex currently being subjected to a spatial DPCM operation and the data of the reference vertex. A spatial operation is expressed by the following equation.

$$D_{i,j} = \tilde{V}_{i,j} - \tilde{V}_{i,Ref} \qquad (5)$$

The spatio-temporal DPCM operator 325 performs a spatial DPCM operation on the vertices of the current keyframe, performs a spatial DPCM operation on the vertices of the previous keyframe using a vertex among the vertices of the previous keyframe, which corresponds to the reference vertex of the current keyframe, as a reference vertex, and calculates differential data between differential data corresponding to the vertices of the current keyframe and differential data corresponding to the vertices of the previous keyframe. In other words, the spatio-temporal DPCM operator 325 performs a temporal DPCM operation on the results of the spatial DPCM operation. The spatio-temporal DPCM operation is expressed by the following equation.

$$D_{i,j} = \tilde{V}_{i,j} - \{\tilde{V}_{i-1,j} + (\tilde{V}_{i,Ref} - \tilde{V}_{i-1,Ref})\} \qquad (6)$$

During the spatial DPCM operation and the spatio-temporal DPCM operation, if $\tilde{V}_{i,Ref}$ or $\{\tilde{V}_{i-1,j} + (\tilde{V}_{i,Ref} - \tilde{V}_{i-1,Ref})\}$ is smaller than a minimum value among the quantized data of each of the components, the minimum value is used for the spatial DPCM operation and the spatio-temporal DPCM operation. On the other hand, if $\tilde{V}_{i,Ref}$ or $\{\tilde{V}_{i-1,j} + (\tilde{V}_{i,Ref} - \tilde{V}_{i-1,Ref})\}$ is greater than a maximum value among the quantized data of each of the components, the maximum value is used for the spatial DPCM operation and the spatio-temporal DPCM operation.

The DPCM operator 320 outputs the calculated differential data to the circular quantizer 330, and the circular quantizer 330 performs a circular quantization operation on the temporal-DPCMed differential data, the spatial-DPCMed differential data, and the spatio-temporal-DPCMed differential data and outputs the results of the circular quantization to the DPCM mode selector 335 in step S444.

Figure 5A:
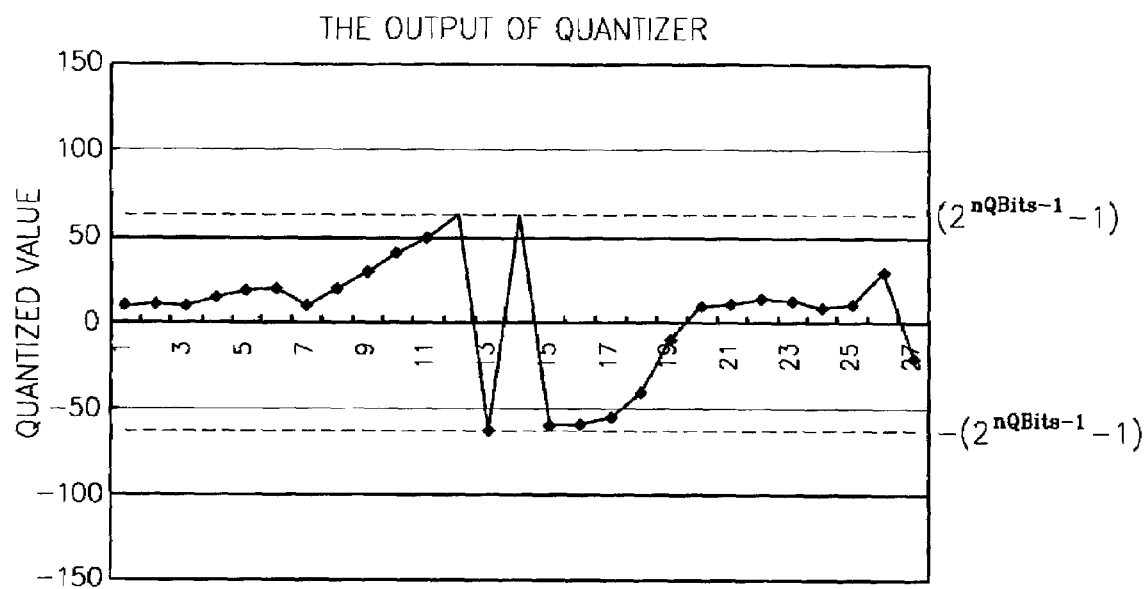
FIGS. 5A through 5C are diagrams illustrating quantized key value data, DPCMed key value data, and circular-quantized key value data according to the present invention, respectively.
Figure 5B:
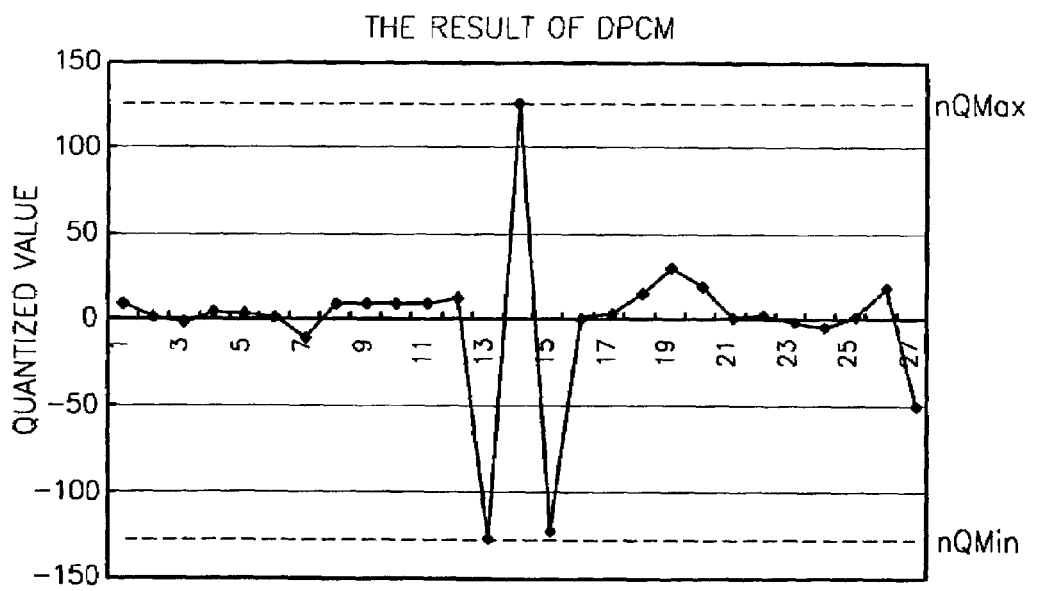

FIG. 5A is a graph showing an example of the output of the quantizer 300, and FIG. 5B is a graph showing the results of performing a DPCM operation on the quantized data shown in FIG. 5A. As shown in FIG. 5B, the range of data to be encoded can be increased as twice as it used be by performing a DPCM operation on quantized data. The purpose of a circular quantization is to perform a DPCM operation while maintaining the data range of quantized values.

In the present invention, the circular quantization is performed on the assumption that a maximum value among DPCMed differential data is circularly connected to a minimum value among the DPCMed differential data. If the result of performing a linear DPCM operation on two consecutive quantized data is greater than half of the maximum value among the DPCMed differential data output from the DPCM operator 320, a maximum range value of the DPCMed differential data output from the DPCM operator 320 is subtracted from the result of the linear DPCM so as to generate a value having a smaller absolute value. On the other hand, if the result of the linear DPCM is smaller than half of a minimum value in the maximum range, the maximum range value is added to the result of the linear DPCM so as to generate a value having a smaller absolute value.

The operation of the circular quantizer 330 is expressed by the following equation.

$$\text{CircularQuantization}(X_i): \qquad (7)$$

$$X'_i = X_i - (n Q\text{Max} - n Q\text{Min} + 1) \text{ (if } X_i \geq 0)$$

$$X'_i = X_i + (n Q\text{Max} - n Q\text{Min} + 1) \text{ (otherwise)}$$

$$\tilde{X}_i = \min(|X_i|, |X'_i|)$$

Figure 5C:
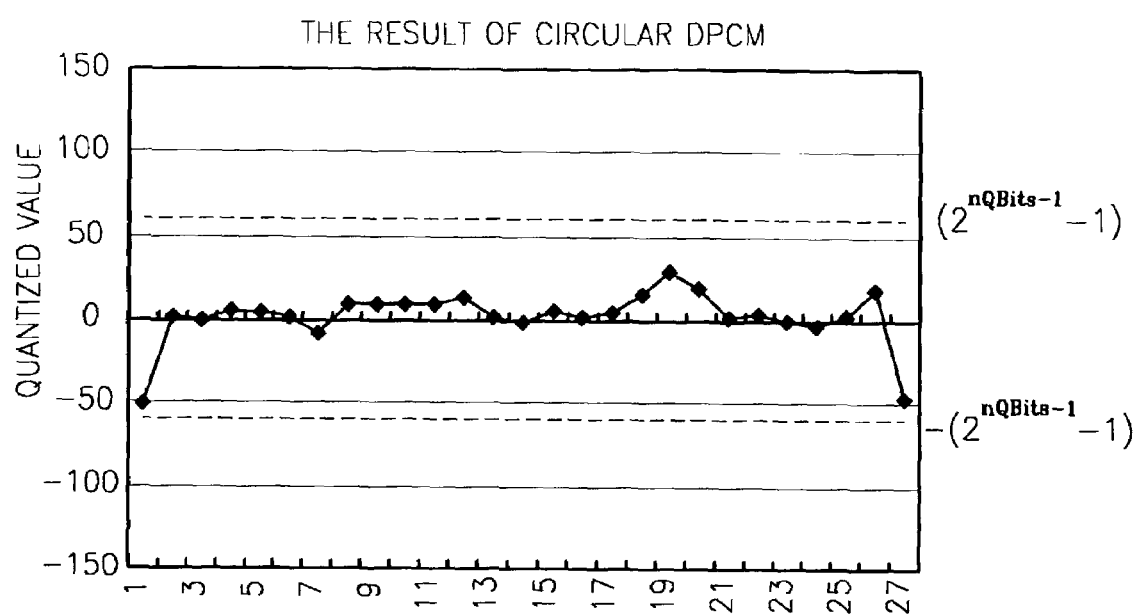

In Equation (7), nQMax represents a maximum value among DPCMed differential data, and nQMin represents a minimum value among the DPCMed differential data. FIG. 5C shows the results of performing circular quantization on the DPCMed differential data shown in FIG. 5B.

The circular quantizer 330 outputs the circular-quantized differential data to the DPCM mode selector 335.

The DPCM mode selector 335 calculates the entropy of the DPCMed differential data each obtained from the temporal DPCM operation, the spatial DPCM operation, and the spatio-temporal DPCM operation, following Equation (4) in step S446.

Thereafter, the DPCM mode selector 335 selects the DPCMed differential data having the lowest entropy among the results of the temporal DPCM operation, the spatial DPCM operation, and the spatio-temporal DPCM operation as a DPCM operation mode of each of the vertices and outputs the DPCMed differential data corresponding to the selected DPCM mode and information on the DPCM mode to the dictionary encoder 340 in step S448.

Hereinafter, the dictionary encoder 340 and its operation will be described with reference to FIGS. 3B and 4C.

Figure 3B:
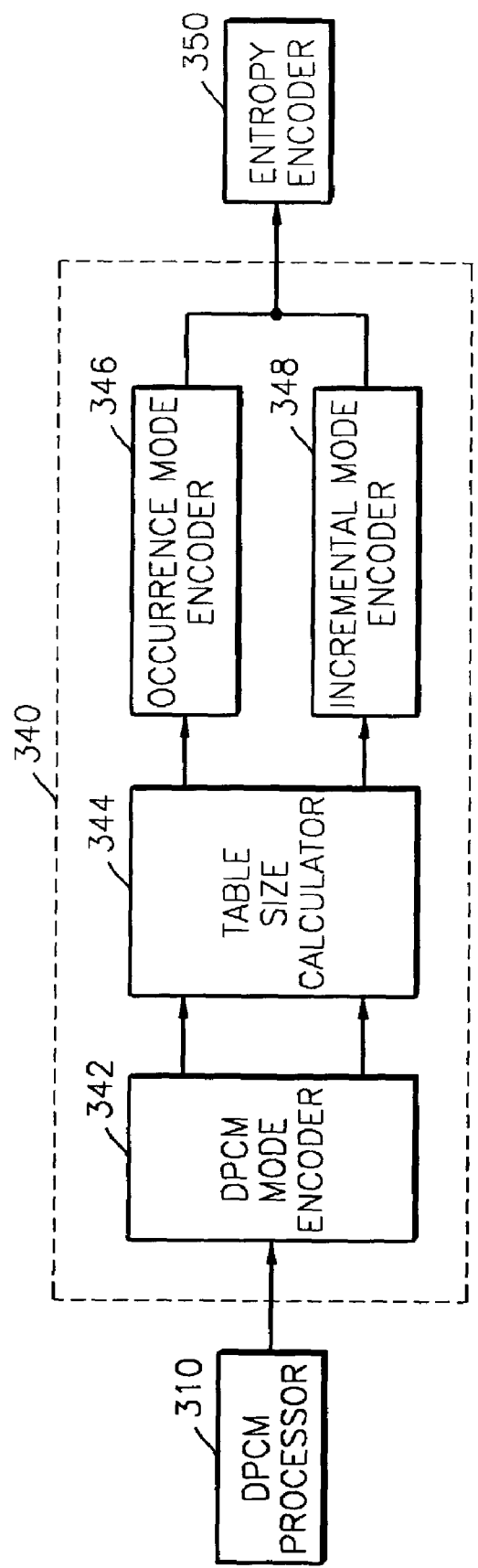
FIG. 3B is a block diagram of a dictionary encoder.

FIG. 3B is a block diagram of the dictionary encoder 340 according to the present invention. Referring to FIG. 3B, the dictionary encoder 340 includes a DPCM mode encoder 342, which encodes the mode of DPCM, which has been performed on the data of each of the components of each of the vertices input thereinto, an occurrence mode encoder 346, which generates symbols, representing values of the differential data of each of the components of each of the vertices, and position indexes representing the positions of the symbols, an incremental mode encoder 348, which generates a symbol flag corresponding to the symbols and the position indexes representing the positions of the symbols, and a table size calculator 344, which calculates the sizes of a symbol table and a symbol flag table for representing the differential data of each of the components of each of the vertices and outputs the differential data input from the DPCM mode encoder 342 to either the occurrence mode encoder 346 or the incremental mode encoder 348.

The dictionary encoder 340 checks if a quantization selection flag of the differential data of each of the components of each of the vertices is 1 and, if it is, performs subsequent processes, which will be described in the following. On the other hand, if the quantization selection flag of the differential data of a certain vertex is 0, which means the vertex has the same quantized value in all the keyframes, the dictionary encoder 340 omits a dictionary encoding process and encodes the quantized value Qmin into a key value header.

Figure 4C:
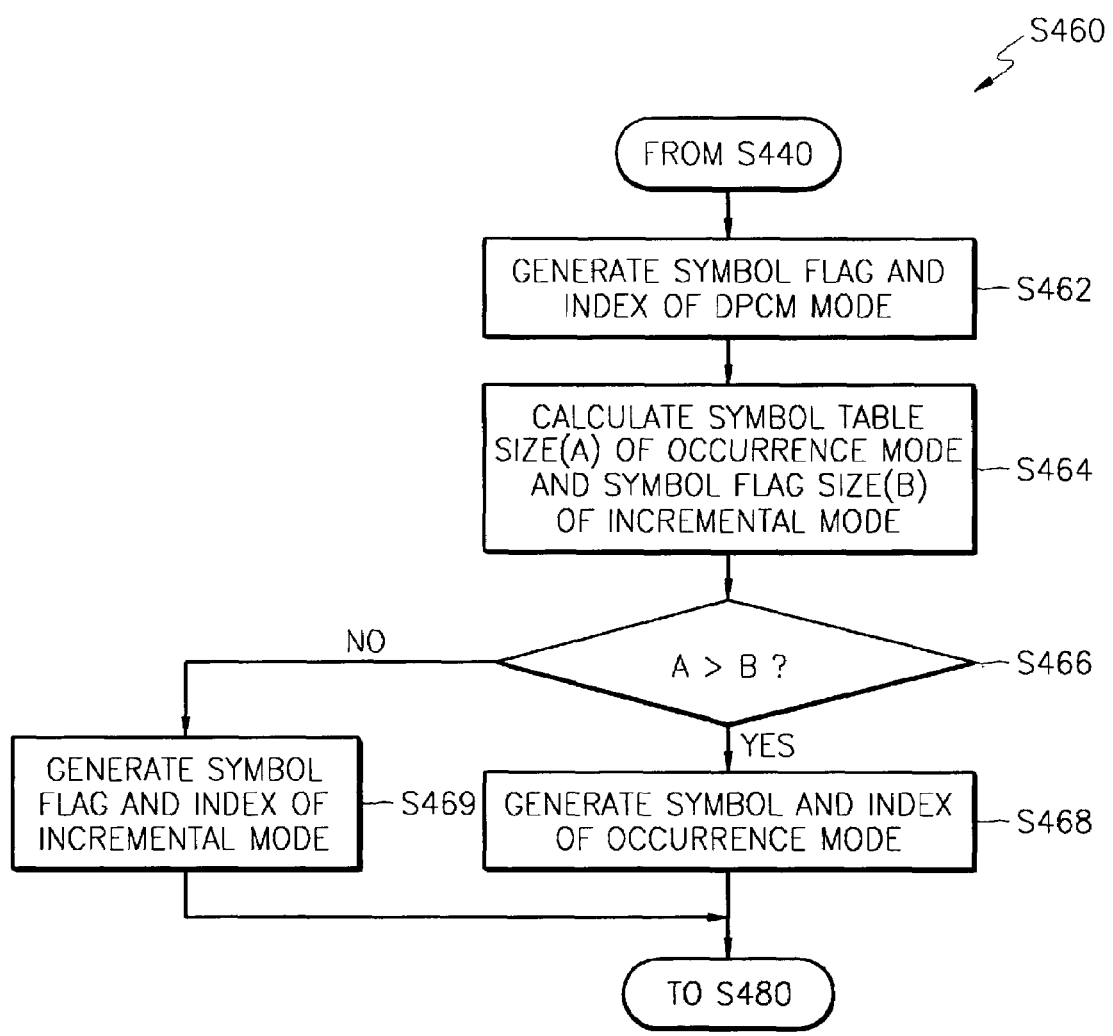
FIG. 4C is a flowchart of dictionary encoding.

FIG. 4C is a flowchart of a dictionary encoding process according to the present invention. Referring to FIG. 4C, the differential data of each of the components of each of the vertices, which have been generated in the DPCM processor 310, are input into the DPCM mode encoder 342, and then the DPCM mode encoder 342 generates the symbols representing the mode of the DPCM operation, which has been performed on the data of each of the components of each of the vertices, and the position indexes indicating the positions of the symbols in step S462.

Figure 6A:
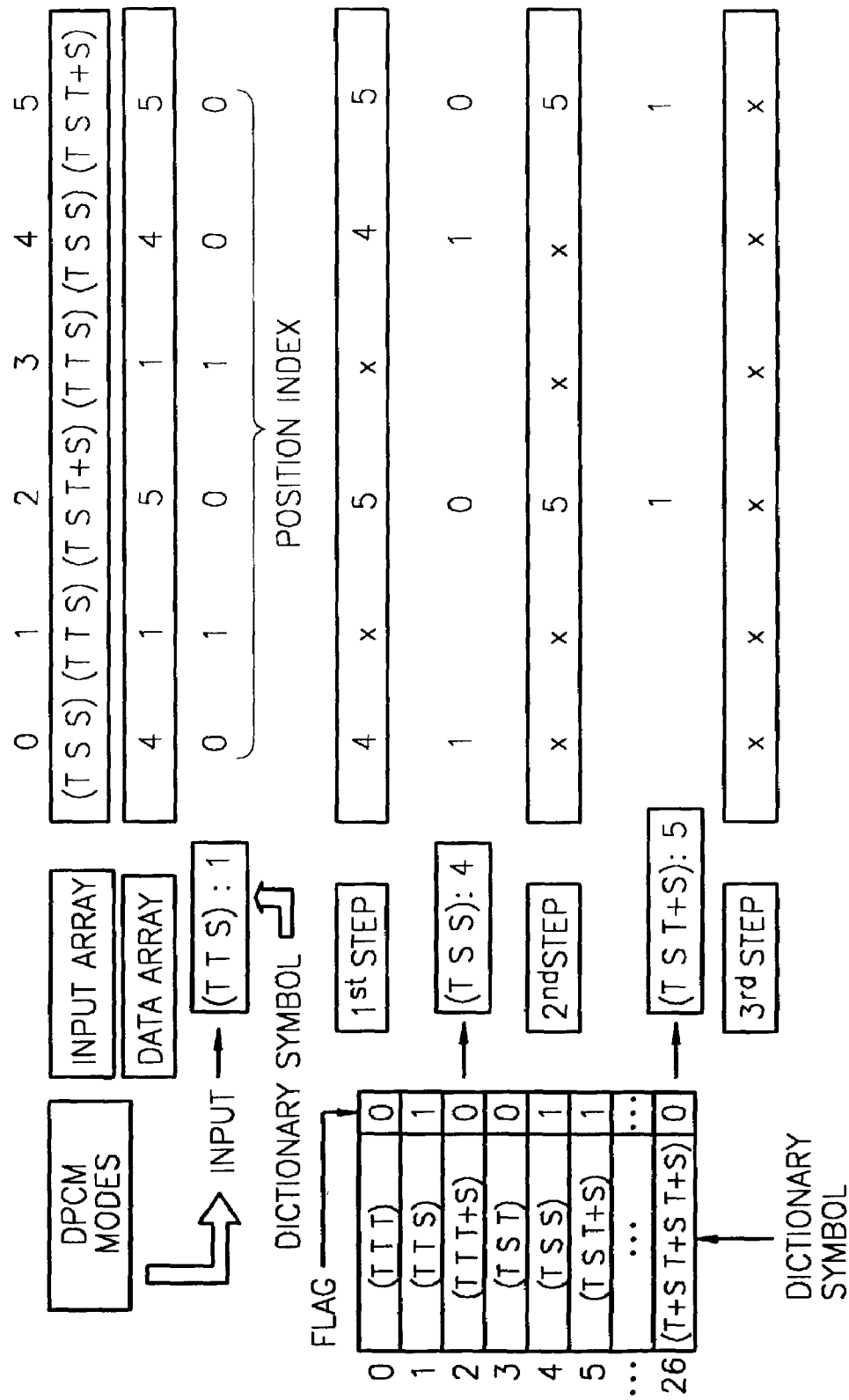
FIG. 6A is a diagram illustrating DPCM mode encoding according to a preferred embodiment of the present invention.

FIG. 6A is a diagram illustrating a method of encoding DPCM modes performed in the DPCM mode encoder 342 according to the present invention. Referring to FIG. 6A, the DPCM mode encoder 342 prepares a table, in which the DPCM modes of each of the components of each of the vertices and their respective symbols are shown, in advance, as shown in Table 4. Table 4 shows combinations of DPCM operations and their corresponding symbols. In Table 4, a temporal DPCM operation, a spatial DPCM operation, and a spatio-temporal DPCM operation are referred to as T, S, and T+S, respectively.

TABLE 4

| Symbols | DPCM Modes |
| --- | --- |
| 0 | (T, T, T) |
| 1 | (T, T, S) |
| 2 | (T, T, T + S) |

TABLE 4-continued

| Symbols | DPCM Modes |
| --- | --- |
| 3 | (T, S, T) |
| 4 | (T, S, S) |
| 5 | (T, S, T + S) |
| 6 | (T, T + S, T) |
| 7 | (T, T + S, S) |
| 8 | (T, T + S, T + S) |
| 9 | (S, T, T) |
| 10 | (S, T, S) |
| 11 | (S, T, T + S) |
| 12 | (S, S, T) |
| 13 | (S, S, S) |
| 14 | (S, S, T + S) |
| 15 | (S, T + S, T) |
| 16 | (S, T + S, S) |
| 17 | (S, T + S, T + S) |
| 18 | (T + S, T, T) |
| 19 | (T + S, T, S) |
| 20 | (T + S, T, T + S) |
| 21 | (T + S, S, T) |
| 22 | (T + S, S, S) |
| 23 | (T + S, S, T + S) |
| 24 | (T + S, T + S, T) |
| 25 | (T + S, T + S, S) |
| 26 | (T + S, T + S, T + S) |

Each of the vertices includes three components x, y, and z, and accordingly, the number of combinations of DPCM operations is 27.

As shown in FIG. 6A, the differential data of each of the vertices corresponds to one of the symbols shown in Table 4 depending on what DPCM operations the differential data have been through. The DPCM mode encoder 342 makes the DPCM modes of the vertices correspond to their respective symbols shown in Table 4 and sets up flags indicating that the symbols exist in the differential data of their respective vertices.

The DPCM mode encoder 342 arranges symbols corresponding to the DPCM modes of the vertices in a column and generates position indexes for the symbols in the order of from a position index for a symbol having the smallest magnitude to a position index for a symbol having the greatest magnitude.

As shown in FIG. 6A, an array of symbols corresponding to the DPCM modes of the differential data of the vertices is (4, 1, 5, 1, 4, 5). Among the symbols, 1 is the smallest symbol and corresponds to (T, T, S). The DPCM mode encoder 342 generates a position index for the symbol 1 so that the places where 1 appears in the array of symbols are represented by 1. Accordingly, the position index is (0, 1, 0, 1, 0, 0).

Thereafter, the DPCM mode encoder 342 generates a position index for the second smallest symbol 4, which corresponds to a DPCM mode (T, S, S), so that the places where 4 is located are represented by 1. In the generation of the position index for the symbol 4, the locations of the symbol 1 are not counted. Accordingly, the position index for the symbol 4 is (1, 0, 1, 0). In the same manner, the DPCM mode encoder 342 generates a position index for a symbol 5, which corresponds to (T, S, T+S). The position index for the symbol 5 is (1, 1).

Thereafter, the DPCM mode encoder 342 outputs the flags and the position indexes to the table size calculator 344.

Referring to FIGS. 3B and 4C again, the table size calculator 344 calculates the size (A) of a symbol table used for encoding the input differential data in an occurrence mode, and the size (B) of a symbol flag used for encoding the input differential data in an incremental mode, which correspond to the symbols in the previously set symbol table in step S464.

The table size calculator 344 compares the size (A=S*(AQP+1) where S represents the number of symbols included in differential data and AQP represents the size of bits used to represent a symbol) of the symbol table used in the occurrence mode encoder 346 with the size (B=$2^{AQP+1}-1$ where AQP represents the size of bits used to represent a symbol) of the symbol flag corresponding the respective symbols in step S446.

The table size calculator 344 outputs the differential data of each of the vertices to the occurrence mode encoder 346, if A is smaller than B, and outputs them to the incremental mode encoder 348, if B is smaller than A.

The operation of the occurrence mode encoder 346 will be described in the following with reference to FIG. 6B.

The occurrence mode encoder 346 generates symbols corresponding to the values of input differential data of each vertex and position indexes indicating the locations of their respective symbols in step S468.

Figure 6B:
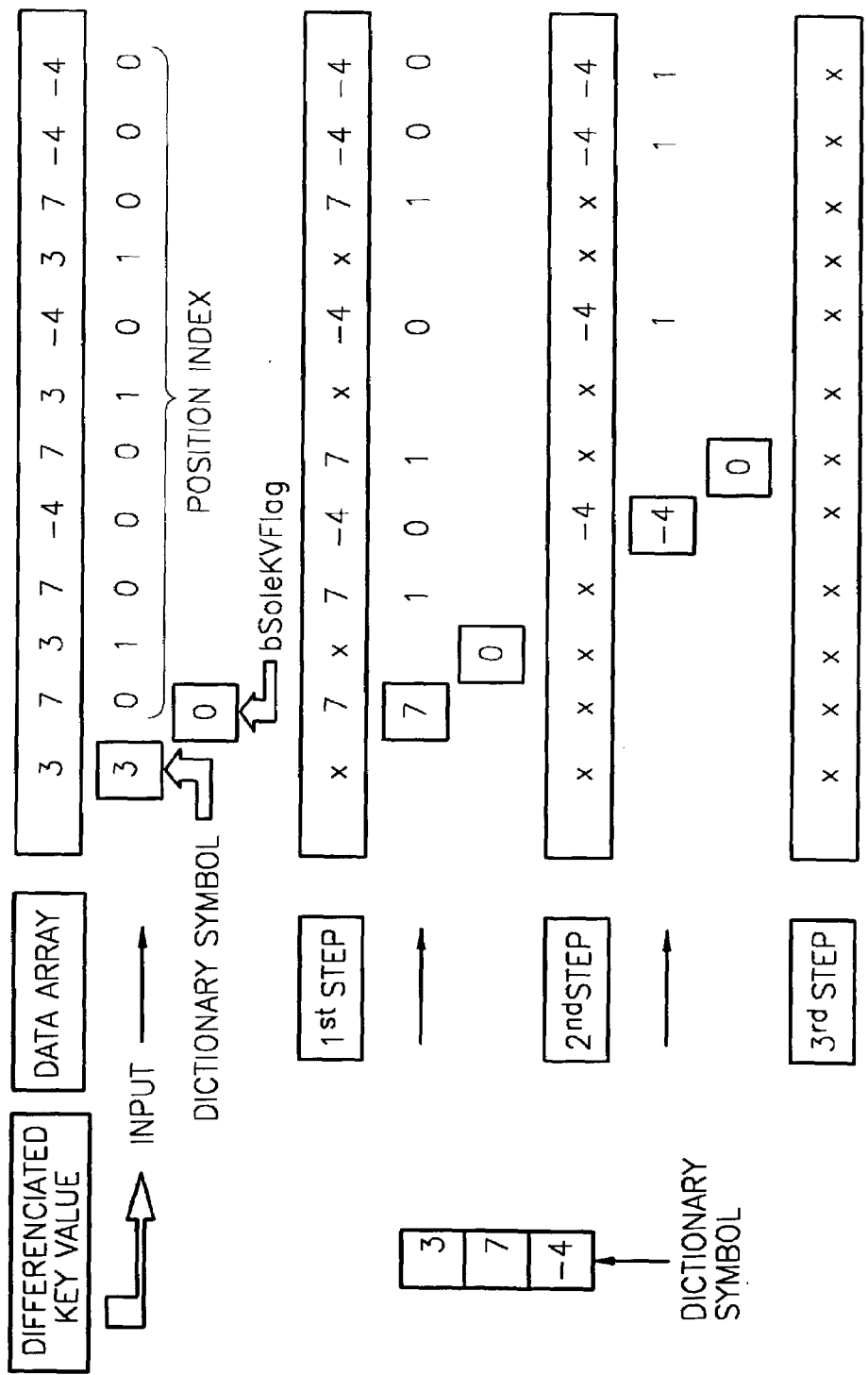
FIG. 6B is a diagram illustrating occurrence mode encoding.

Referring to FIG. 6B, when input differential data of a vertex is (3, 7, 3, 7, −4, 7, 3, −4, 3, 7, −4, −4), the occurrence mode encoder 346 prepares a table, in which the symbols 3, 7, and −4 corresponding to differential values of differential data of each vertex are sequentially written in a row, in step S468.

The occurrence mode encoder 346 encodes the first symbol 3 in the array of the symbols and generates a position index for the symbol 3 so that the places where 3 is located are represented by 1 and the other places are represented by 0. The position index for the symbol 3 is (0 1 0 0 0 1 0 1 0 0 0).

Next, the occurrence mode encoder 346 generates a position index for the next symbol 7. As shown in FIG. 6B, the locations of the previous symbol are not counted again in the generation of the position index for the next symbol. Accordingly, the position index for the symbol 7 is (1 0 1 0 1 0 0).

In the occurrence mode encoder 346, all position indexes for symbols are generated considering only the locations of symbols which have not been encoded yet, and thus a position index for a symbol −4 is (1 1 1).

In FIG. 6B, a flag bSoleKV is set to 0. The flag bSoleKV indicates whether or not a symbol appears only one time in an array of symbols of differential data. If a symbol appears only one time and thus its position index consists of only 0s, bSoleBK is set to 1 for the corresponding symbol; and the position index of the corresponding symbol is not encoded. The occurrence mode encoder 346 outputs the symbols of the input differential data, the position indexes of the symbols, and bSoleKV to the entropy encoder 350 for entropy-encoding differential data.

Hereinafter, the operation of the incremental mode encoder 348 according to the present invention will be described with reference to FIG. 6C.

The incremental mode encoder 348 generates a symbol flag indicating whether or not symbols included in a predetermined symbol table exist in input differential data and position indexes for the symbols in step S469.

The incremental mode encoder 348 generates in advance a table for symbols which are expected to exist in input differential data. In the table, symbols are arranged in column in the order from a symbol having the lowest absolute value to a symbol having the greatest absolute value, and between two symbols having the same absolute value, the one having a positive value is arranged in a higher row than the other. Accordingly, symbols are written in the table in the order of 0, 1, −1, 2, −2, 3, −3, . . . . The size of a symbol flag corresponding to symbols in a symbol table is $2^{AQP+1}-1$. For example, if AQP is 2, the number of symbols which can be represented by a symbol flag is 7. The symbol flag is set to 1 if a value corresponding to a symbol exists in differential data. Position indexes are generated for only symbols, for which the symbol flag is set to 1.

Figure 6C:
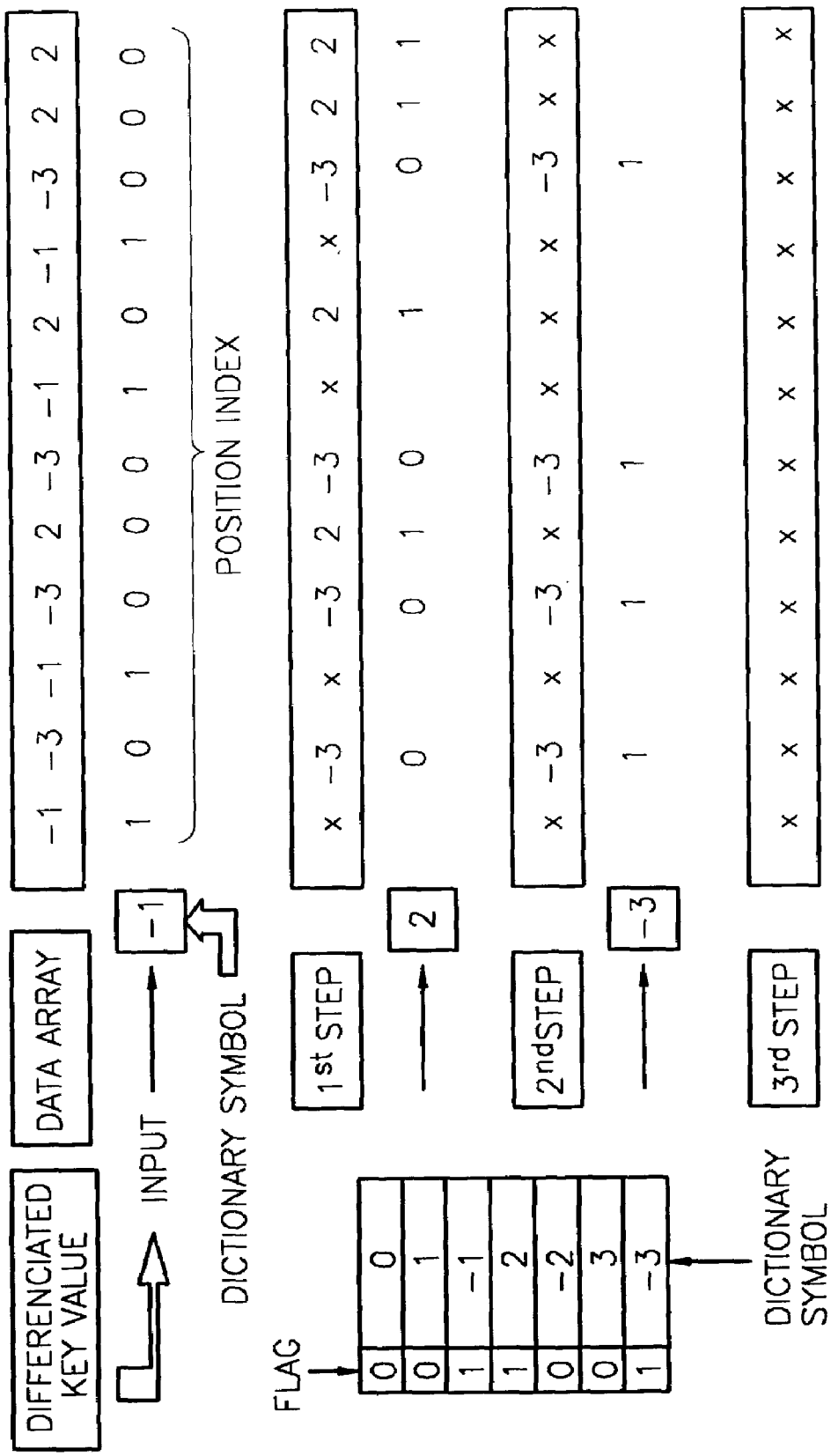
FIG. 6C is a diagram illustrating incremental mode encoding.

Referring to FIG. 6C, if differential data input into the incremental mode encoder 348 are (−1, −3, −1, −3, 2, −3, −1, 2, −1, −3, 2, 2), symbols existing in the differential data are (−1, 2, −3), and thus the symbol flag (0, 0, 1, 1, 0, 0, 1) is determined.

The incremental mode encoder 348 generates a position index for a symbol which is located in a higher row in the symbol table than other symbols first. As shown in FIG. 6C, the incremental mode encoder 348 sets up the places where a symbol −1, which ranks first in the symbol table among the symbols existing in the differential data, appears at 1 and sets up other places at 0 so that a position index for the symbol −1 is (1 0 1 0 0 0 1 0 1 0 0 0).

Next, the incremental mode encoder 348 generates a position index (0 0 1 0 1 0 1 1) for a symbol 2 without considering the positions of the symbol −1, which has already been encoded. Finally, the incremental mode encoder 348 generates a position index (1 1 1 1) for a symbol 3 without considering the positions of the symbols −1 and 2, which have already been encoded. The incremental mode encoder 348 outputs the symbol flag and the position indexes for their respective symbols to the entropy encoder 350.

All position indexes generated by the occurrence mode encoder 346 and the incremental mode encoder 348 have a flag called nTrueOne which indicates whether or not original position indexes have been inversed. Specifically, if nTrueOne is set to 0, position indexes are considered obtained by inversing their original position indexes. In a case where position indexes include a lot of 1s, it is possible to enhance the arithmetic encoding efficiency by inversing the position indexes so as to increase the number of 0s.

Hereinafter, the operation of the entropy encoder 350 will be described with reference to FIG. 4.

The entropy encoder 350 according to the present invention entropy-encodes the symbol flag representing the symbols of the differential data and the position indexes for the symbols, which are input from the incremental mode encoder 348, and entropy-encodes the symbols of the differential data and their respective position indexes, which are input from the occurrence mode encoder 346, using a function enodeSignedQuasiAAC( ).

In encodeSignedQuasiAAC( ), an adaptive-arithmetic-encoded bitstream is generated using a context regarding input values and their signs. In particular, in encode-SignedQuasiAAC( ), a first bit which is not 0 is encoded, then its sign is encoded, and other bits are encoded using a zero context.

Figure 4D:
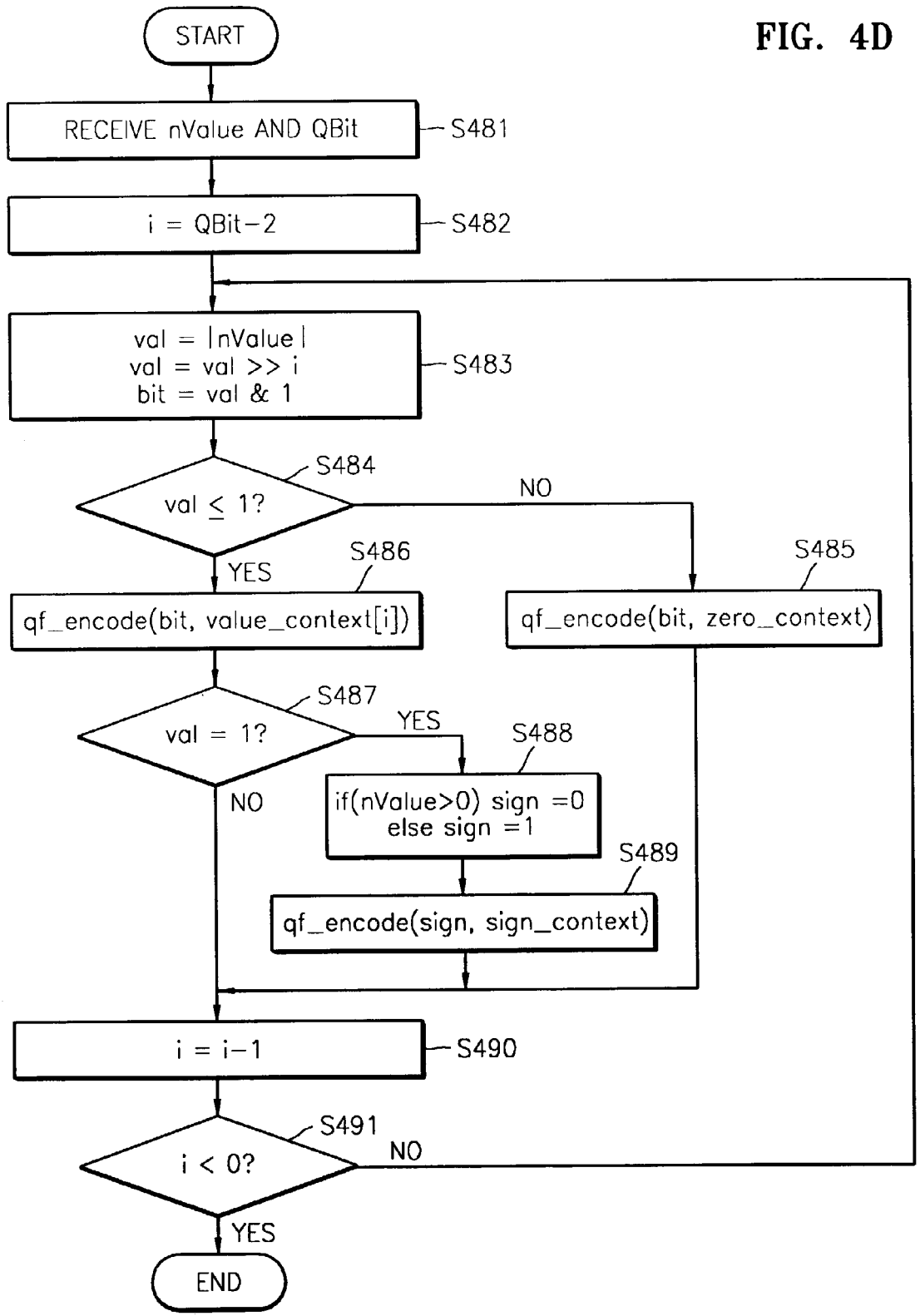
FIG. 4D is a flowchart of entropy-encoding according to a preferred embodiment of the present invention.

FIG. 4D is a flowchart of a process of encoding a symbol using encodeSignedQuasiAAC( ).

The entropy encoder 350 receives a symbol nValue of differential data to be encoded and its bit size QBit in step S481.

The entropy encoder 350 subtracts 2 from nQBit and stores the result of the subtraction as a variable i in step S482.

In step S483, the entropy encoder 350 stores the absolute value of the symbol nValue as a variable val and performs a shift-right (SR) operation on val as many times as i. The entropy encoder 350 performs an logic AND operation on 1 and the result of the SR operation and stores the result of the logic AND operation as a variable bit.

In the first cycle of the process of encoding a symbol using encodeSignedQuasiAAC( ), a first bit among input values to be entropy-encoded except for sign bits is detected, and in subsequent cycles, other bits are read one by one.

The entropy encoder 350 checks if val is not greater than 1 in step S484. If val is greater than 1, the value of 'bit' is encoded using a function qf_encode( ) under a zero context in step S485. On the other hand, if val is not greater than 1, the value of 'bit' is encoded using the function qf_encode( ) under an i-th context in step S486.

When val is not greater than 1, the entropy encoder 350 checks again if val is 1 in step S487. If val is 1, the sign of nValue is set up in step S488 and nValue is encoded based on its sign and a sign context in step S489.

When the encoding process for one bit is completed, the entropy encoder 350 decrease i by 1 in step S490 and then checks if the current value of i is smaller than 0 in step S491. The entropy encoder 350 entropy-encodes the input values by repeatedly performing S483 through S490 until i is smaller than 0.

Accordingly, the entropy encoder 350 encodes a first bit of an input value, which is not 0, following a context allotted to the first bit and encodes other bits following the zero context.

Hereinafter, information to be encoded into a key value header in the key value header encoder 370 will be described with reference to FIG. 2A.

The key value header encoder 370 receives an input coordinate coordinator and encodes a data mode, the number of vertices in each keyframe, the number of bits required for the number of vertices, and the maximum number of effective digits of each floating-point number.

The key value header encoder 370 encodes a quantization bit number, minimum values among key value data of each component of each of the vertices and a maximum data range among the data ranges of each of the components of each of the vertices, and maximum and minimum values among quantized data of each of the components of each of the vertices.

The key value header encoder 370 receives the mode of a DPCM operation, which has been performed on the data of each of the components of each of the vertices, from the DPCM processor 310, receives a dictionary encoding mode from the dictionary encoder 340, and encodes the DPCM operation mode and the dictionary encoding mode.

Hereinafter, an apparatus and a method for decoding an encoded coordinate interpolator according to the present invention will be described with reference to FIGS. 7A and 7B.

Figure 7A:
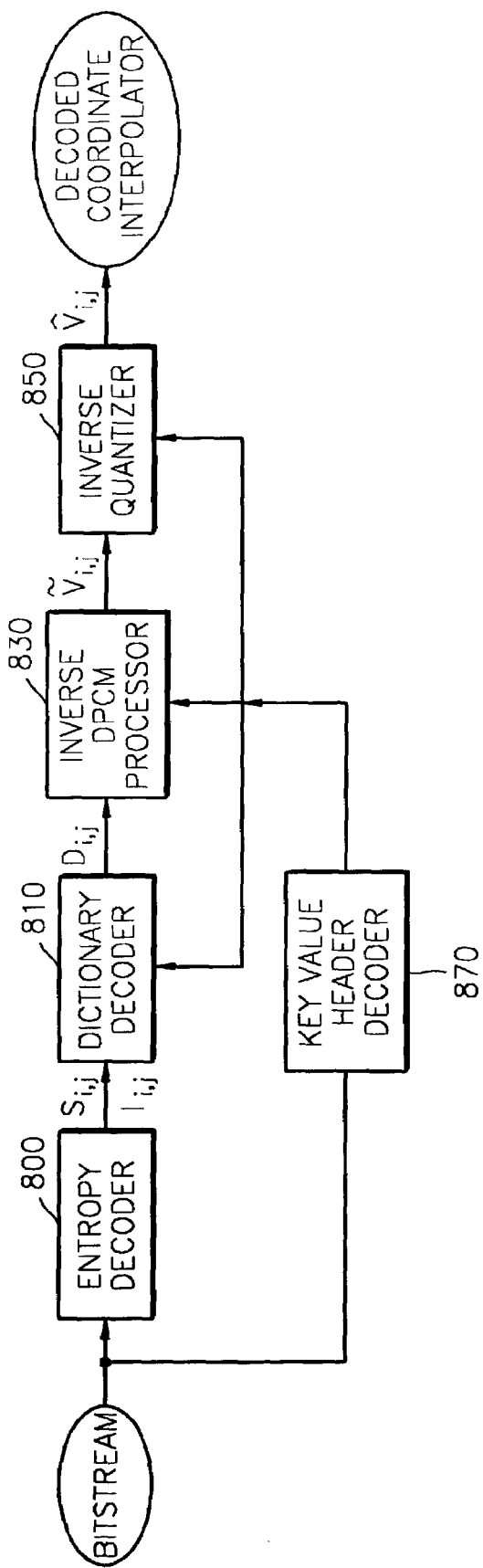
FIG. 7A is a block diagram of an apparatus for decoding key value data of a coordinate interpolator according to a preferred embodiment of the present invention.
Figure 7B:
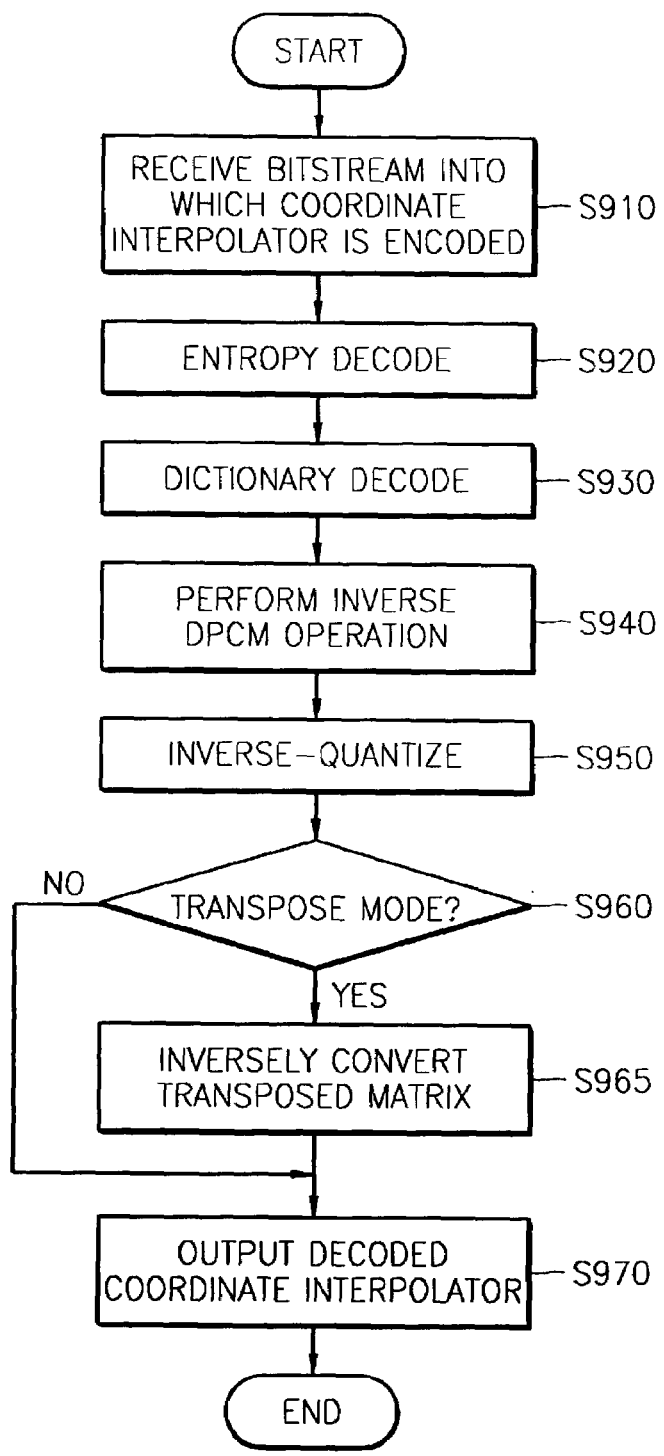
FIG. 7B is a flowchart of a method for decoding key value data of a coordinate interpolator according to a preferred embodiment of the present invention.

FIG. 7A is a block diagram of an apparatus for decoding an encoded coordinate interpolator according to a preferred embodiment of the present invention, and FIG. 7B is a flowchart of a method for decoding an encoded coordinate interpolator according to a preferred embodiment of the present invention.

Referring to FIG. 7A, an apparatus for decoding an encoded coordinate interpolator according to the present invention includes an entropy decoder 800, which entropy-decodes an input bitstream and thus generates data to be dictionary-decoded, including symbols of DPCMed differential data, a symbol flag, position indexes for the symbols, and a DPCM operation mode, a dictionary decoder 810, which generates differential data based on the symbols of the data to be dictionary-encoded and their position indexes, an inverse DPCM processor 830, which generates quantized data by performing a predetermined inverse DPCM operation on dfferential data based on a DPCM operation mode, an inverse quantizer 850, which generates retrieved key value data by inverse-quantizing quantized data, and a key value header decoder 870, which decodes information required for decoding a coordinate interpolator from the input bitstream and outputs the information to the dictionary decoder 810, the inverse DPCM processor 830, and the inverse quantizer 850.

A method for decoding an encoded coordinate interpolator according to the present invention will be described in the following with reference to FIG. 7B.

A bitstream, into which a coordinate interpolator is encoded, is input into the entropy decoder 800 in step S910, and then the entropy decoder 800 decodes the input bitstream in step S920. If the input bitstream has been encoded in an occurrence mode, the entropy decoder 800 outputs symbols of each vertex and their position indexes to the dictionary decoder. On the other hand, if the input bitstream has been encoded in an incremental mode, the entropy decoder 800 outputs a symbol flag indicating the existence of symbols and the position indexes for the symbols to the dictionary decoder 810.

The dictionary decoder 810 generates differential data by decoding the symbols and position indexes input from the entropy decoder 800 in an occurrence mode or decoding the symbol flag and position indexes input from the entropy decoder 800 in an incremental mode, depending on the input dictionary encoding mode, and outputs the generated differential data to the inverse DPCM processor 830 in step S930.

The inverse DPCM processor 830 generates quantized key value data by performing one of an inverse temporal DPCM operation, an inverse spatial DPCM operation, and an inverse spatio-temporal DPCM operation on the differential data input from the dictionary decoder 810, depending on the decoded DPCM operation mode of the input differential data and outputs the quantized key value data to the inverse quantizer 850 in step S940.

The inverse quantizer 850 inverse-quantizes the quantized key value data input from the inverse DPCM processor 830 using the minimum values among the data of each of the components and the maximum data range, which are input from the key value header decoder 870, in step S950.

The inverse quantizer 850 checks if a matrix of the inverse-quantized key value data has been converted into a transpose matrix during the encoding process in step S960 and inversely converts the transpose matrix if the matrix of the inverse-quantized key value data has been transposed, in step S965.

The inverse quantizer 850 outputs key value data of a retrieved coordinate interpolator in step S970.

Hereinafter, the apparatus and method for decoding an encoded coordinate interpolator will be described more fully with reference to FIGS. 8A through 9B.

The entropy decoder 800 decodes a bitstream indicating a DPCM mode from an input bitstream first and then decodes an array of data including bSelFlag, nKVACodingBit, nQMin, and nQMax.

In the encoding process, bSelFlag and nKVACodingBit are set to 1 and 0, respectively, at first. If bSelFlag is decoded into 1, the entropy decoder 800 decodes nKVACodingBit, nQMin, and nQMax. On the other hand, bSelFlag is decoded into 0, the entropy decoder 800 decodes nQMin only.

The entropy decoder 800 decodes nDicModeSelect indicating a dictionary encoding mode after the decoding of the array of the data bSelFlag, nKVACodingBit, nQMin and nQMax. Depending on the value of nDicModeSelect, bitstreams to be decoded are divided into two different kinds, which will be described in the following.

Figure 10:
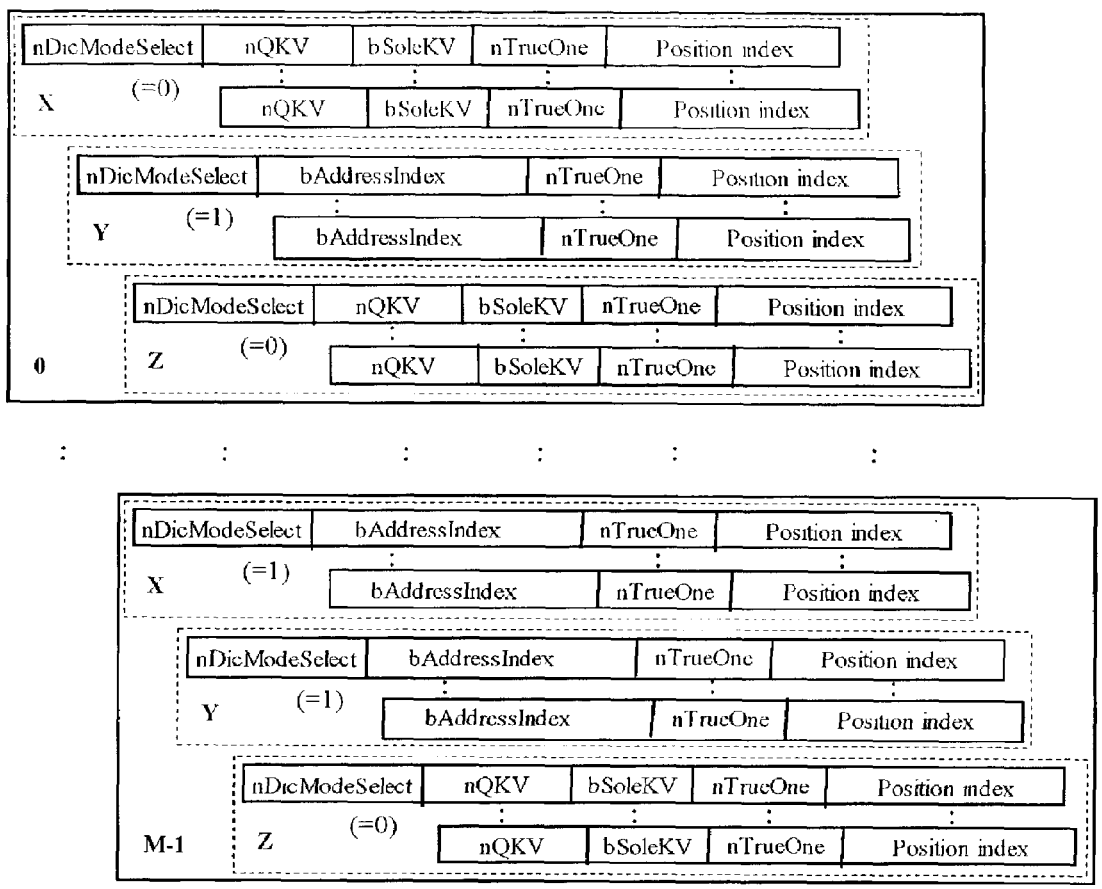
FIG. 10 is a diagram illustrating vertices used in a coordinate interpolator and a bitstream of data of the components of each of the vertices.

FIG. 10 is a diagram illustrating each vertex of a coordinate interpolator and the structure of a bitstream of component data of each of the vertexes. As shown in FIG. 10, if nDicModeSelect is 0, a bitstream includes symbols and position indexes, which have been encoded in an occurrence mode encoder. On the other hand, if nDicModeSelect is 1, a bitstream includes a symbol flag and position indexes, which have been encoded in a incremental mode encoder.

The entropy decoder according to the present invention has been described above as using a function decodeSignedQuasiAAC( ), which is realized in program codes shown in FIG. 19. In the function decodeSignedQuasi AAC( ), an adaptive-arithmetic-encoded bitstream is decoded using a context regarding input values and their signs. In particular, in the function decodeSigned QuasiAAC( ), bits subsequent to a sign bit is decoded using a zero context. The entropy decoder 800 outputs the decoded data to the dictionary decoder 810.

Figure 8A:
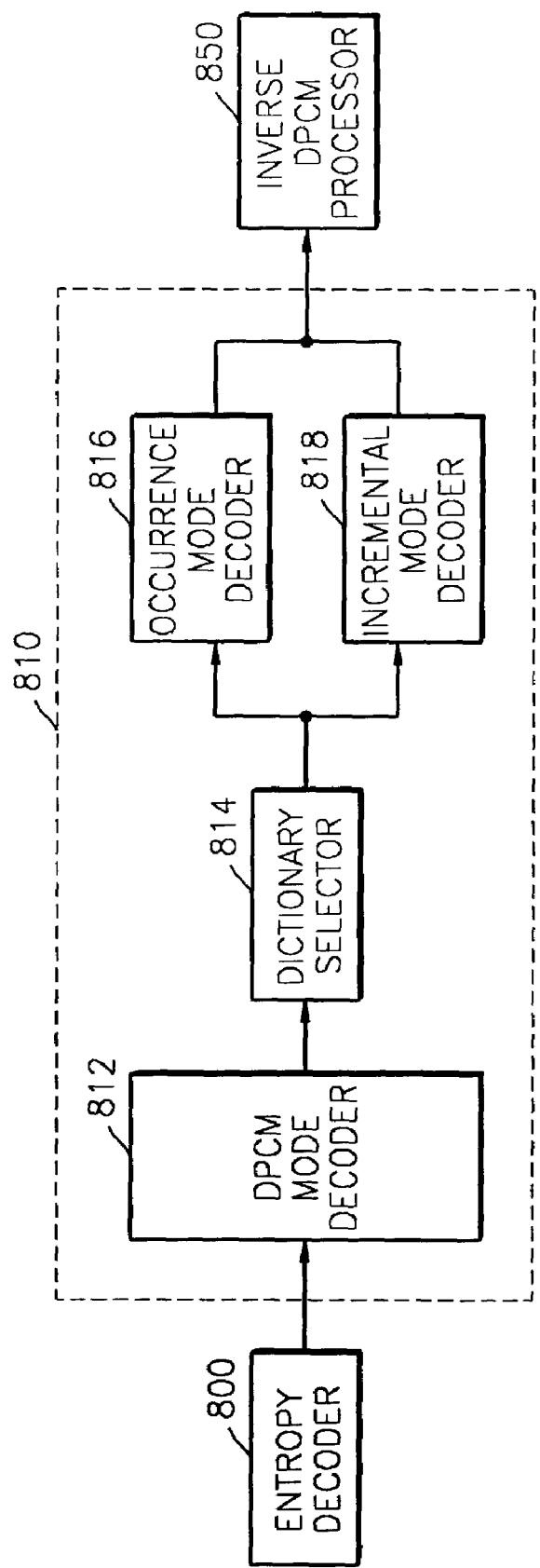
FIG. 8A is a block diagram of a dictionary decoder according to a preferred embodiment of the present invention.
Figure 9A:
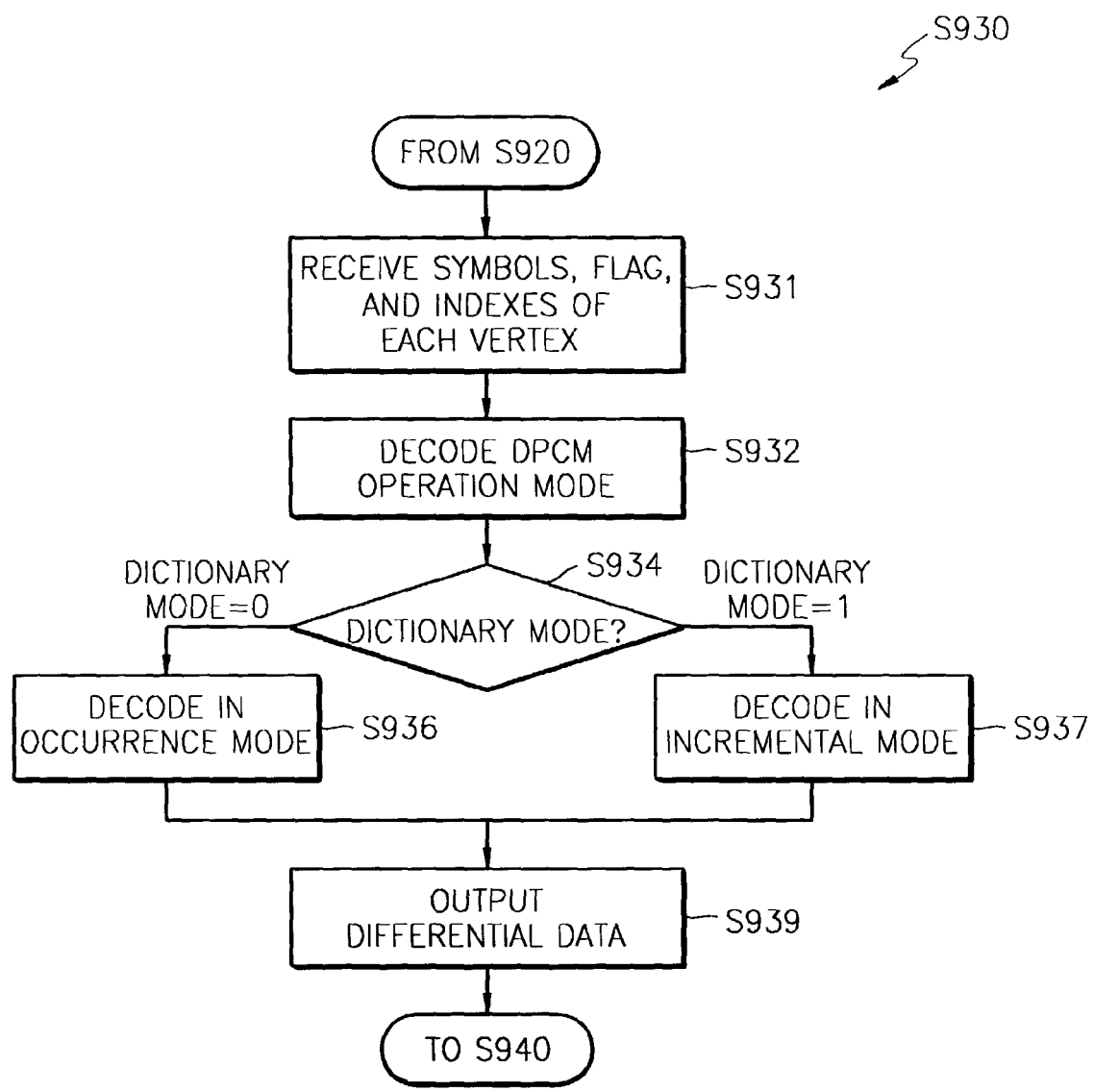
FIG. 9A is a flowchart of dictionary decoding according to a preferred embodiment of the present invention.

FIG. 8A is a block diagram of the dictionary decoder 810 according to the present invention, and FIG. 9A is a flowchart of dictionary encoding.

As shown in FIG. 8A, the dictionary decoder 810 includes a DPCM mode decoder 812, which retrieves a DPCM mode of each vertex input thereinto, a dictionary mode selector 814, which selects a dictionary decoding mode of each of the input vertices, an occurrence mode decoder 816, which receives symbols of each component of each of the vertices and position indexes for the symbols from the dictionary mode selector 814 and retrieves differential data, and an incremental mode decoder 818, which receives a symbol flag and the position indexes for the symbols from the dictionary mode selector 814 and retrieves differential data.

Referring to FIG. 9A, entropy-decoded component data of each of the vertices including the symbols, the symbol flag, and the position indexes are input into the DPCM mode decoder 812 in step S931.

The DPCM mode decoder 812 decodes the mode of an inverse DPCM operation, which will be performed on differential data of each of the components of each of the vertices in the inverse DPCM processor 830, before dictionary-decoded differential data are output to the inverse DPCM processor 830 in step S932.

Hereinafter, DPCM mode decoding will be described with reference to FIG. 11A.

DPCM mode decoding is the same as incremental mode decoding, which will be described later, except that the number of symbols representing combinations of DPCM modes of each of the components of each of the vertices is fixed at 27 and accordingly, the size of a symbol table is also fixed at 27.

The DPCM mode decoder 812 receives a DPCM mode flag and records symbols corresponding to the DPCM mode flag in a data array following input position indexes.

Figure 11A:
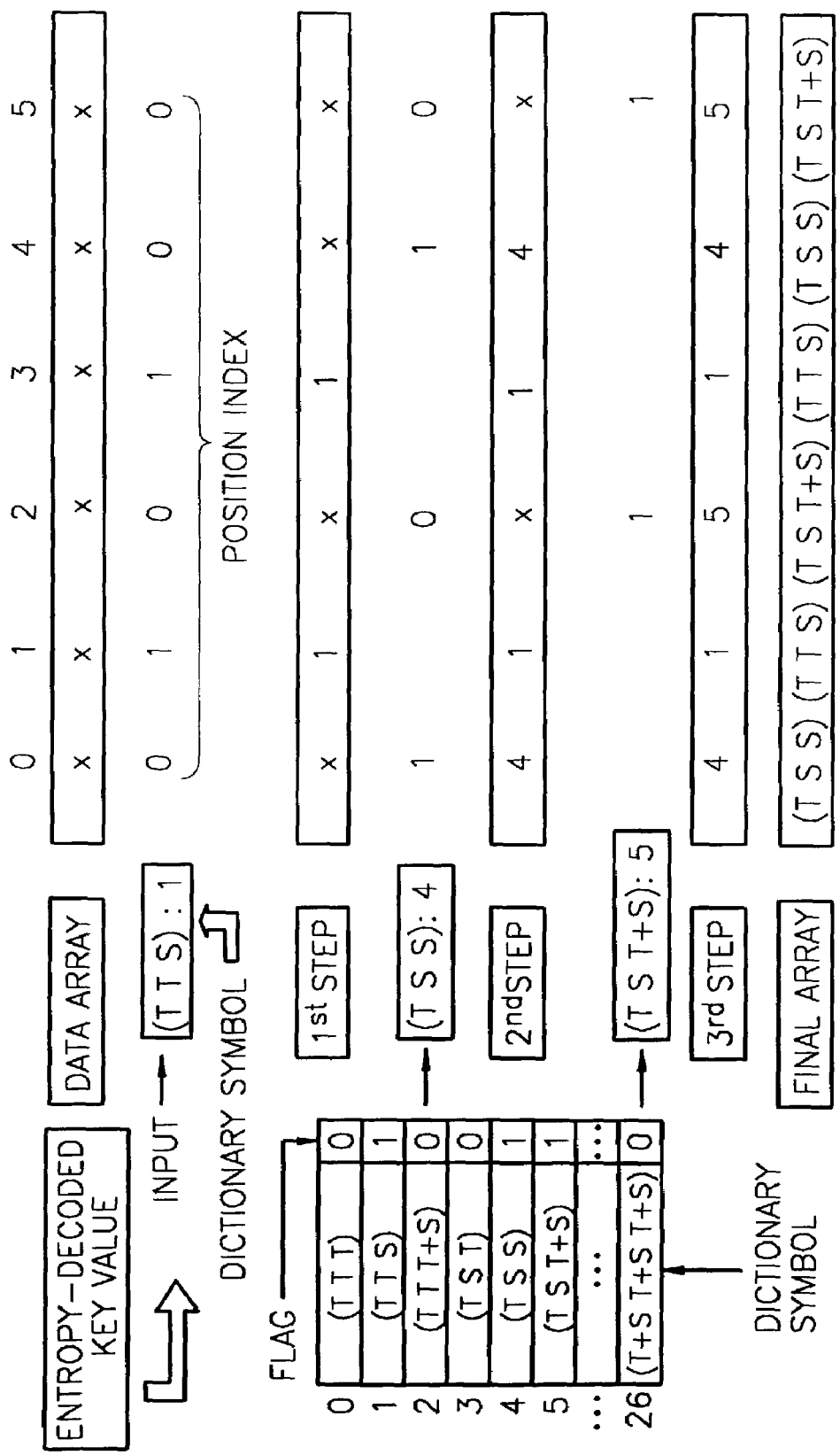
FIG. 11A is a diagram illustrating DPCM mode decoding.

For example, as shown in FIG. 11A, symbols corresponding to the input DMCM mode flag are 1 (T T S), 4 (T S S), and 5 (T S T+S) and their respective indexes are (0 1 0 1 0 0), (1 0 1 0), and (1 1). Accordingly, an array of data (X 1 X 1 X X) is retrieved using the symbol 1 and its position index (0 1 0 1 0 0), an array of data (4 1 X 1 4 X) is retrieved using the symbol 4 and its position index (1 0 1 0), and an array of data (4 1 5 1 4 5) is retrieved using the symbol 5 and its position index (1 1).

The retrieved data array (4 1 5 1 4 5) is converted into an array of combinations of DPCM modes (T S S) (T T S) (T S T+S) (T T S) (T S S) (T S T+S). Accordingly, it is possible to identify what kind of DPCM has been performed on each of the components of each of the vertices based on the retrieved data array.

The DPCM mode decoder 812 outputs the differential data of each of the components of each of the vertices to the dictionary mode selector 814 together with the decoded DPCM mode information.

The dictionary mode selector 814 outputs the component data of each of the vertices input from the DPCM mode decoder 812 to the occurrence mode decoder 816 or the incremental mode decoder 818, depending on the value of nDicModeSelect of each of the components of each of the vertices in step S934.

The dictionary mode selector 814 outputs the component data of a vertex to the occurrence mode decoder 816 if nDicModeSelect is 0 and outputs the component data of the vertex to the incremental mode decoder 818 if nDicModeSelect is 1.

The occurrence mode decoder 816 retrieves the symbol data and position indexes of each of the components into differential data in step S936.

Figure 11B:
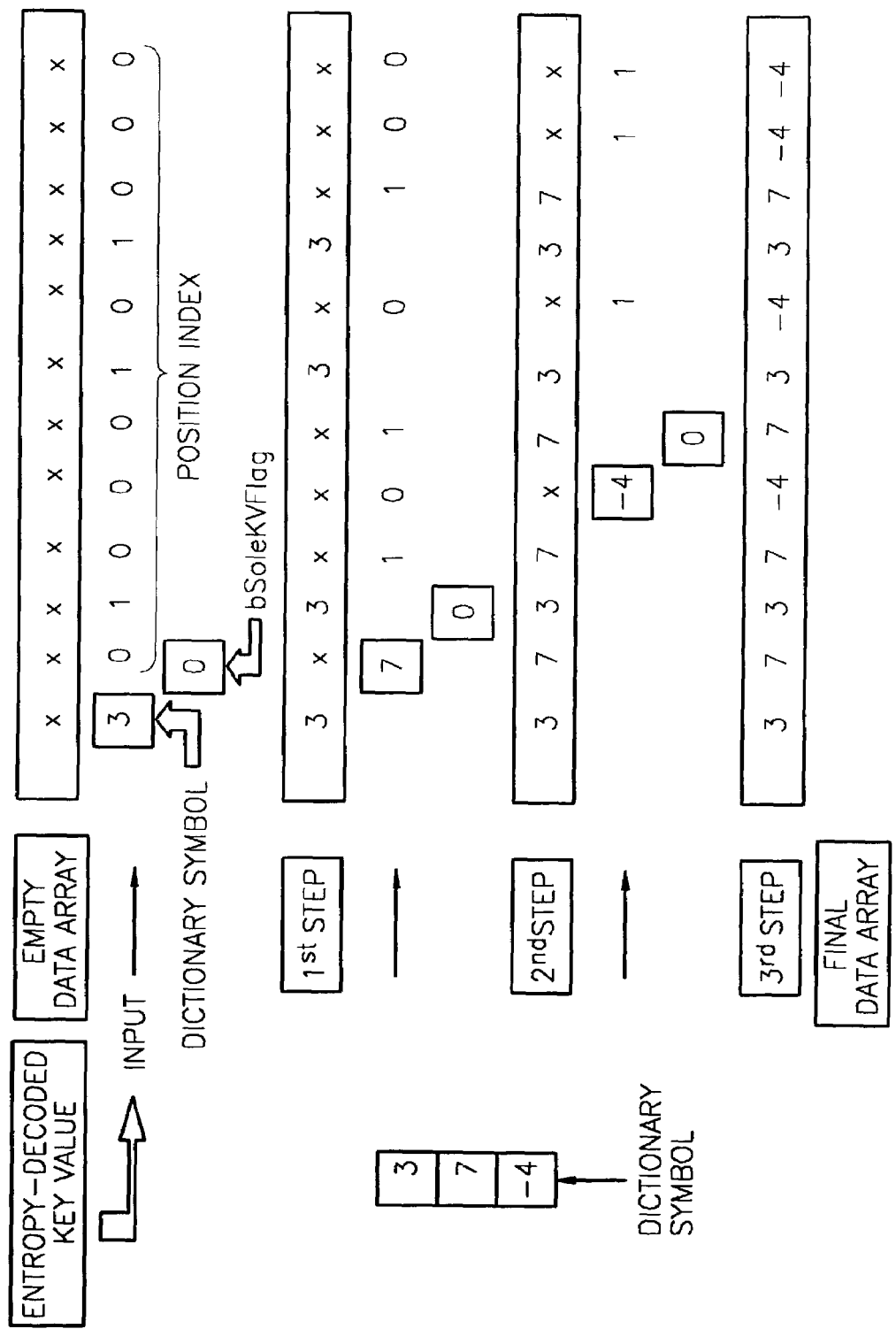
FIG. 11B is a diagram illustrating occurrence mode decoding.

FIG. 11B is a diagram illustrating an example of occurrence mode decoding. Referring to FIG. 11B, the occurrence mode decoder 816 receives symbol data from the dictionary mode selector 814 and checks bSoleKV and nTrueOne.

If bSoleKV indicates there are a plurality of input symbols in differential data and nTrueOne indicates position indexes have not been inversed, the occurrence mode decoder 816 retrieves differential data by inserting the input symbols in their respective places in a data array, which are indicated by their respective position indexes.

For example, the occurrence mode decoder 816 receives symbols 3, 7, and −4 sequentially and their respective position indexes (0 1 0 0 0 1 0 1 0 0 0), (1 0 1 0 1 0 0), and (1 1 1).

The occurrence mode decoder 816 records the first symbol 3 in a differential data array following the position index (0 1 0 0 0 1 0 1 0 0 0). Accordingly, (3 X 3 X X X 3 X 3 X X X) is obtained by inserting the symbol 3 into places in the differential data array, which correspond to the places where 1 is located in the position index (0 1 0 0 0 1 0 1 0 0 0).

The occurrence mode decoder 816 retrieves the next symbol 7. During retrieving the symbol 7, the positions of the symbol 3 in the differential data array are not considered so that the position index for the symbol 7 is not (0 1 0 1 0 0 0 1 0 0) but (1 0 1 0 1 0 0).

The occurrence mode decoder 816 records the symbol 7 in a first place among places in the differential data array, which are not occupied by the symbol 3, and then records the symbol 7 in places in the differential data array, which correspond to the places where 1 is located in the position index (1 0 1 0 1 0 0). Accordingly, after retrieving the symbol 7, the differential data array is (3 7 3 7 X 7 3 X 3 7 X X).

The occurrence mode decoder 816 retrieves the symbol −4 following the index (1 1 1), and thus the resulting differential data array is (3 7 3 7 −4 7 3 −4 3 7 4 −4).

If bSoleKV is set to 1, this means that there is only one input symbol in differential data, and there is no position index for the input symbol. Accordingly, the occurrence mode decoder 816 records the input symbol into a first place in a blank differential data array and performs a process for retrieving the next symbols.

Figure 11C:
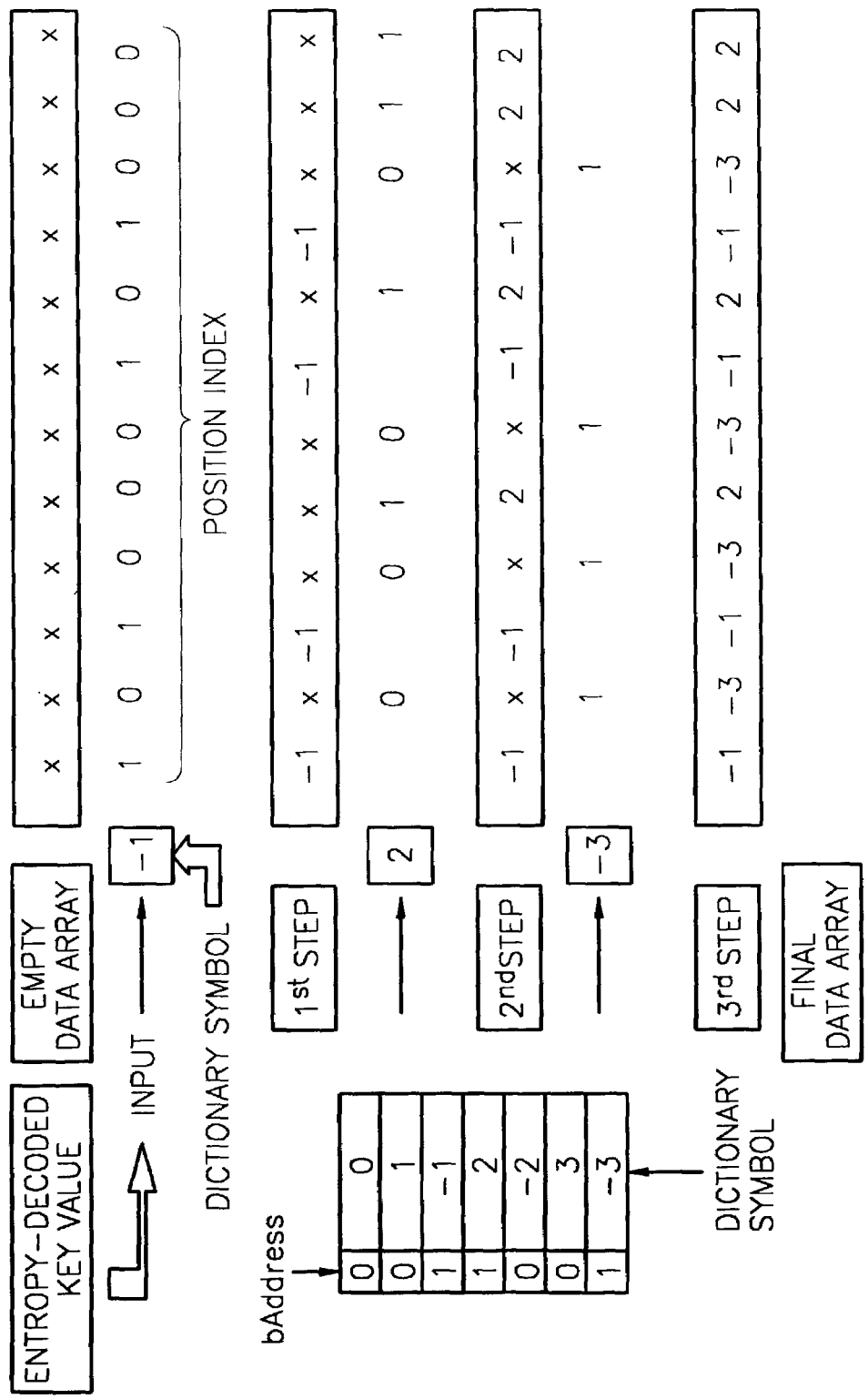

The incremental mode decoder 818 retrieves the symbol flag and position indexes of each of the components into differential data in step S936. Hereinafter, incremental mode decoding will be described with reference to FIG. 11C.

The incremental mode decoder 818 receives the symbol flag indicating whether or not symbols exist in differential data, nTrueOne indicating whether or not position indexes have been inversed, and the position indexes from the dictionary mode selector 814.

The incremental mode decoder 818 decodes symbols included in the differential data based on the input symbol flag. In a symbol table used for incremental mode decoding, like the one used for the incremental mode encoding, symbols are arranged in column in the order from a symbol having the lowest absolute value to a symbol having the greatest absolute value, and between two symbols having the same absolute value, the one having a positive value is arranged in a higher row than the other. The size of a symbol flag is $2^{nKVCodingBit+1}-1$ where nKVCodingBit represents the number of quantization bits decoded in the entropy decoder 800. Accordingly, if a symbol flag is (0 0 1 1 0 0 1), the incremental mode decoder 818 decodes −1, 2, and −3 as symbols existing in the differential data.

The position indexes input after the symbol flag are (1 0 1 0 0 0 1 0 1 0 0 0), (0 0 1 0 1 0 1 1), and (1 1 1 1) and correspond to the symbols −1, 2, and 3, respectively.

The incremental mode decoder 818 records the symbol −1 in places in a differential data array corresponding to the places where 1 is located in the position index (1 0 1 0 0 0 1 0 1 0 0 0) so that the resulting data array is (−1 X −1 X X X −1 X −1 X X X).

Next, the incremental mode decoder 818 retrieves the symbol 2 by recording 2 in places in the differential data array corresponding to the places where 1 is located in the position index (0 0 1 0 1 0 1 1). During the retrieving of the symbol 2, the positions of the first symbol −1 in the differential data array are not considered so that the resulting differential data array is (−1 X −1 X 2 X −1 2 −1 X 2 2).

The incremental mode decoder 81 retrieves the symbol −3 by recording −3 in places in the differentia data array corresponding to the places where 1 is located in the position index (1 1 1 1) so that the resulting differential data array is (−1 −3 −1 −3 2 −3 −1 2 −1 −3 2 2).

The occurrence mode decoder 816 and the incremental mode decoder 818 retrieves the differential data of each of the components of each of the vertices and outputs the retrieved differential data to the inverse DPCM processor 830 in step S939.

Figure 8B:
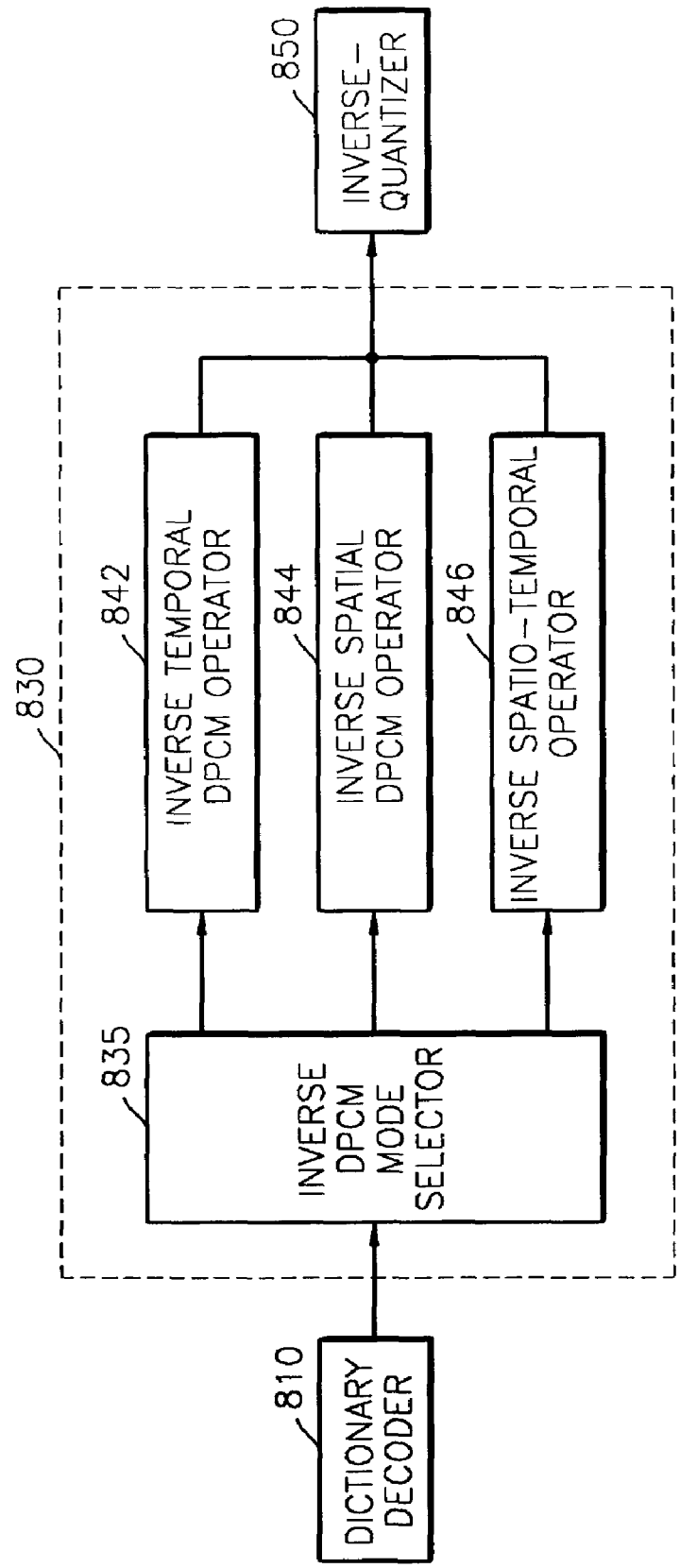
FIG. 8B is a block diagram of an inverse DPCM processor.
Figure 9B:
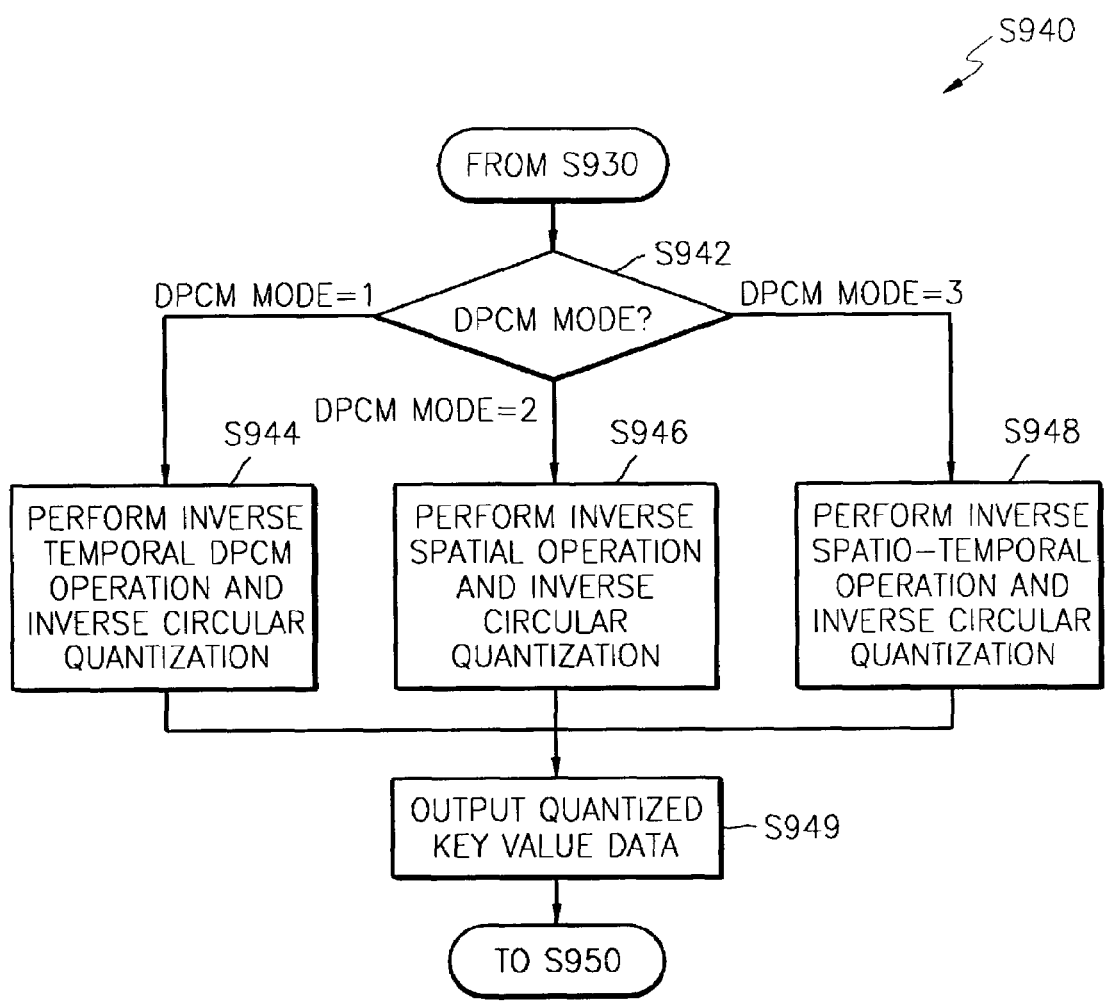
FIG. 9B is a flowchart of an inverse DPCM operation.

FIG. 8B is a block diagram of the inverse DPCM processor 830 according to the present invention, and FIG. 9B is a flowchart of an inverse DPCM operation.

Referring to FIG. 8B, the inverse DPCM processor 830 according to the present invention includes an inverse temporal DPCM operator 842, which performs an inverse temporal DPCM operation and an inverse circular quantization operation on input differential data and then outputs quantized key value data of a coordinate interpolator, an inverse spatial DPCM operator 844, which performs an inverse spatial DPCM operation and an inverse circular quantization operation on input differential data and then outputs quantized key value data, an inverse spatio-temporal DPCM operator 846, which performs an inverse spatio-temporal DPCM operation and an inverse circular quantization operation on input differential data and then outputs quantized key value data, and an inverse DPCM mode selector 835, which outputs differential data input thereinto to one of the inverse temporal DPCM operator 842, the inverse spatial DPCM operator 844, and the inverse spatio-temporal DPCM operator 846.

Referring to FIG. 9B, the inverse DPCM mode selector 835 determines an inverse DPCM operation, which will be performed on differential data input thereinto, depending on the DPCM operation mode of each of the components of each of the vertices retrieved in the DPCM mode decoder 812, and outputs the input differential data of each of the components of each of the vertices following the inverse DPCM operation mode in step S942.

Each of the DPCM operators 842, 844, and 846 performs an inverse DPCM operation and an inverse circular quantization operation on the differential data input thereinto at the same time.

The inverse temporal DPCM operator 842 performs an inverse temporal DPCM operation on the input differential data following Equation (8) in step S944, the inverse temporal DPCM operator 844 performs an inverse spatial operation on the input differential data following Equation (9) in step S946, and the inverse spatio-temporal DPCM operator 846 performs an inverse spatio-temporal DPCM operation on the differential data input thereinto following Equation (10) in step S948.

$$\tilde{V}_{i,j}=D_{i,j}+\tilde{V}_{i-1,j} \qquad (8)$$

$$\tilde{V}_{i,j}=D_{i,j}+\tilde{V}_{i,Ref} \qquad (9)$$

$$\tilde{V}_{i,j}=D_{i,j}+\{\tilde{V}_{i-1,j}+(\tilde{V}_{i,Ref}-\tilde{V}_{i-1,Ref})\} \qquad (10)$$

In Equations (8) through (10), $\tilde{V}_{i,j}$ represents quantized key value data of a j-th vertex in an i-th keyframe, $D_{i,j}$ represents differential data of the j-th vertex in the i-th keyframe, and Ref represents a reference vertex.

In Equations (9) and (10), if $\tilde{V}_{i,Ref}$ or $\{\tilde{V}_{i-1,j}+(\tilde{V}_{i,Ref}-\tilde{V}_{i-1,Ref})\}$ is smaller than a minimum value among the quantized key value data of each of the components, the minimum value is used instead of $\tilde{V}_{i,Ref}$ or $\{\tilde{V}_{i-1,j}+(\tilde{V}_{i,Ref}-\tilde{V}_{i-1,Ref})\}$. If $\tilde{V}_{i,Ref}$ or $\{\tilde{V}_{i-1,j}+(\tilde{V}_{i,Ref}-\tilde{V}_{i-1,Ref})\}$ is greater than a maximum value among the quantized key value data of each of the components, the maximum value is used instead of $\tilde{V}_{i,Ref}$ or $\{\tilde{V}_{i-1,j}+(\tilde{V}_{i,Ref}-\tilde{V}_{i-1,Ref})\}$.

Each of the DPCM operators 842, 844, and 846 performs an inverse DPCM operation using Equation (11) and performs an inverse circular quantization operation at the same time so as to extend the range of differential data, which has been reduced during the encoding process.

InverseCircularQuantization($\tilde{X}_i$): (11)

$X_i' = \tilde{X}_i - (nQ\text{Max} - nQ\text{Min} + 1)$ (if $\tilde{X}_i \geq 0$)

$X_i' = \tilde{X}_i + (nQ\text{Max} - nQ\text{Min} + 1)$ (otherwise)

$\hat{X}_i = \hat{X}_{i-1} + \tilde{X}_i$ (if $nQ\text{Min} \leq \hat{X}_{i-1} + \tilde{X}_i \leq nQ\text{Max}$)

$\hat{X}_i = \hat{X}_{i-1} + X_i'$ (f $nQ\text{Min} \leq \hat{X}_{i-1} + X_i' \leq n\text{Max}$)

In Equation (11), $\tilde{X}_i$ is an input value which is the same as $D_{i,j}$, $\hat{X}_{i-1}$ is a previously inversely circular-quantized value, like $\tilde{V}_{i,Ref}$ or $\{\tilde{V}_{i-1,j}+(\tilde{V}_{i,Ref}-\tilde{V}_{i-1,Ref})\}$. nQMax and nQMin represent a maximum value and a minimum value, respectively, among DPCMed differential data.

The inverse DPCM processor 830 outputs key value data of each of the components of each of the vertices, which have been inverse-DPCMed and inversely circular-quantized, to the inverse quantizer 850 in step S949.

Referring to FIG. 7B, the inverse quantizer 850 converts minimum values fMin_X, fMin_Y, and fMin_Z, which are input from the key value header decoder 870, among input component data and a maximum range value fMax into binary numbers following Equation (2) and inverse-quantizes the quantized key value data input from the inverse DPCM processor 830 by substituting fMin_X, fMin_Y, fMin_Z, and fMax into Equation (12).

$$\hat{V}_{i,j,x} = f\text{Min\_X} + \frac{\tilde{V}_{i,j,x}}{2^{nKVQBits} - 1} \times f\text{Max}$$

$$\hat{V}_{i,j,y} = f\text{Min\_Y} + \frac{\tilde{V}_{i,j,x}}{2^{nKVQBits} - 1} \times f\text{Max}$$

$$\hat{V}_{i,j,z} = f\text{Min\_Z} + \frac{\tilde{V}_{i,j,z}}{2^{nKVQBits} - 1} \times f\text{Max}$$

(12)

In Equation (12), nKVQBits represents a quantization bit size used for inverse quantization.

The inverse quantizer 850 must output the inverse-quantized key value data of each of the components of each of the vertices in the form of matrix shown in Table 2. In order to do this, the inverse quantizer 850 checks before outputting the inverse-quantized key value data if the mode of the inverse-quantized key value data is a transpose mode in step S960. If the mode of the inverse-quantized key value data is a transpose mode, the inverse quantizer 850 generates and outputs decoded key value data of a coordinate interpolator by inversely converting the transpose matrix in step S965. Hereinafter, SDL program codes for decoding an encoded bitstream and variables used in such program codes will be described with reference to FIGS. 12 through 18.

FIG. 12 shows an uppermost class for reading a bitstream of a compressed coordinate interpolator. CoordlKeyValueHeader and CoordlKeyValue are classes for reading key value information corresponding to key value field data of a conventional coordinate interpolator node. A function qf_start( ) is used to initialize an arithmetic decoder before reading AAC-encoded data.

FIG. 13 shows program codes used for generating a bitstream using key value header information required for decoding key value data.

Key value header data are decoded after key header data are decoded. The key value header includes the number of vertices, a parameter for quantization of key value data, and maximum and minimum values for quantization. bTranspose is a flag indicating whether a transpose mode or a vertex mode. If btranspose is 1, a transpose mode is selected in a decoding process. On the other hand, if bTranspose is 0, a vertex mode is selected. nKVQBit is a quantization bit used for retrieving floating-point numbers through inverse quantization. nCoordQBit is the size of bits used to represent nNumberOfCoord, which represents the number of vertices. nKVDigit is used after inverse quantization and represents the maximum number of effective digits of key value data. A class KeyValueMinMax retrieves a minimum value used for inverse quantization and a maximum data range, which are divided into their mantissas and exponents. Other pieces of header information include a maximum value and minimum values among maximum values and minimum values among the quantized key value data of each of the components of each of the vertices. Specifically, nXQMinOfMax represents a minimum value among maximum values among the quantized key value data of the x component of each of the vertices. nNumKeyCodingBit represents the bit size of nNumberOfKey, which represents the number of key data. The information including nXQMinOfMax and nNumberOfKey is required to decode key value data.

FIGS. 14A and 14B are diagrams illustrating program codes for realizing an apparatus for decoding a DPCM mode according to the present invention. The meaning of each variable shown in FIGS. 14A and 14B is as follows. nDPCMMode represents a DPCM mode of each component (x, y, z) of each vertex. When nDPCMMode is set to 1, 2, or 3, it represents a temporal DPCM mode, a spatial DPCM mode, or a spatio-temporal DPCM mode, respectively. bSelFlag is a flag for selecting each of the components of each of the vertices. Only components of each of the vertices, for which bSelFlag is set to 1, are encoded using the dictionary encoder 340. selectionFlagContext is a context for reading bSelFlag. nKVACodingBit represents encoding bits for each of the components of each of the vertices. aqpXContext, aqpYContext, and aqpZContext are contexts for the X-axis, the Y-axis, and the Z-axis, respectively, which are used to read nKVACodingBit.

nRefVertex is an index of a reference vertex for all the vertices. refContext is a context for reading nRefVertex.

nQMin represents a minimum value among DPCMed differential data of each of the components of each of the vertices. qMinContext represents a context for reading nQMin, and qMinSignContext is a context for reading the sign of nQMin.

nQMax represents a maximum value among DPCMed differential data of each of the components of each of the vertices. qMaxContext is a context for reading nQMax, and aMaxSignContext is a context for reading the sign of nQMax.

FIG. 15 is a diagram illustrating program codes for decoding a DPCM mode according to the present invention, and the meaning of each variable shown in FIG. 15 is as follows.

bAddressOfDPCMMode indicates the usage of each DPCM dictionary symbol, which is constituted by a combination of DPCM modes for each component in a DPCM dictionary table. Each of the vertices includes three components, and three different kinds of DPCM T, S, and T+S modes may exist in the components of each of the vertices. As shown in Table 3, there are 27 dictionary symbols representing combinations of the three DPCM modes. dpcmModeDicAddressContext is a context for reading bAddressOfDPCMMode.

bDPCMIndex indicates which DPCM symbol has been used for each of the vertices. dpcmModelDicindexContext is a context for reading bDPCMIndex.

FIG. 16 is a diagram illustrating program codes for decoding a dictionary encoding mode according to the present invention, and the meaning of each variable shown in FIG. 16 is as follows.

dDicModeSelect indicates which dictionary encoding mode has been used during dictionary encoding. When dDicModeSelect is 1, it means that the dictionary encoding mode is an incremental mode. On the other hand, if dDicModeSelect is 0, it means that the dictionary encoding mode is an occurrence mode.

FIG. 17 is a diagram illustrating program codes for realizing an incremental mode decoding method according to the present invention, and the meaning of each variable shown in FIG. 17 is as follows.

bAddress indicates whether or not incremental mode dictionary symbols representing quantized key values have been used. The number of symbols used in an incremental mode table is $2^{nKVcodingBit+1} - 1$. dicAddressContext is a context for reading bAddress.

nTrueOne indicates whether or not index data have been inversed. When nTrueOne is 1, a value 1 in a position index is considered as a real value indicating the position of a symbol. When nTrueOne is 0, a value 0 in the position index is considered as a real value indicating the position of the symbol.

bAddrIndex indicates an incremental mode symbol used for each of the components of each of the vertices. dicindexContext is a context for reading bAddrIndex.

FIG. 18 is a diagram illustrating program codes for realizing an occurrence mode decoding method according to the present invention, and the meaning of each variable shown in FIG. 18 is as follows.

nQKV includes occurrence mode symbols, which are quantized key value data. kvXContext, kvYContext, and kvZContext are contexts for reading nQKV, and kvSignContext is a context for reading the sign of nQKV.

bSoleKV indicates whether or not a decoded symbol appears in differential data only one time. If a decoded symbol appears in differential data only one time, soleKV is set to 1. dicSoleKVContext is a context for reading bSoleKV.

bDicIndex indicates which dictionary symbol has been used for each of the components of each of the vertices. dicindexContext is a context for reading bDicIndex.

Figure 20A:
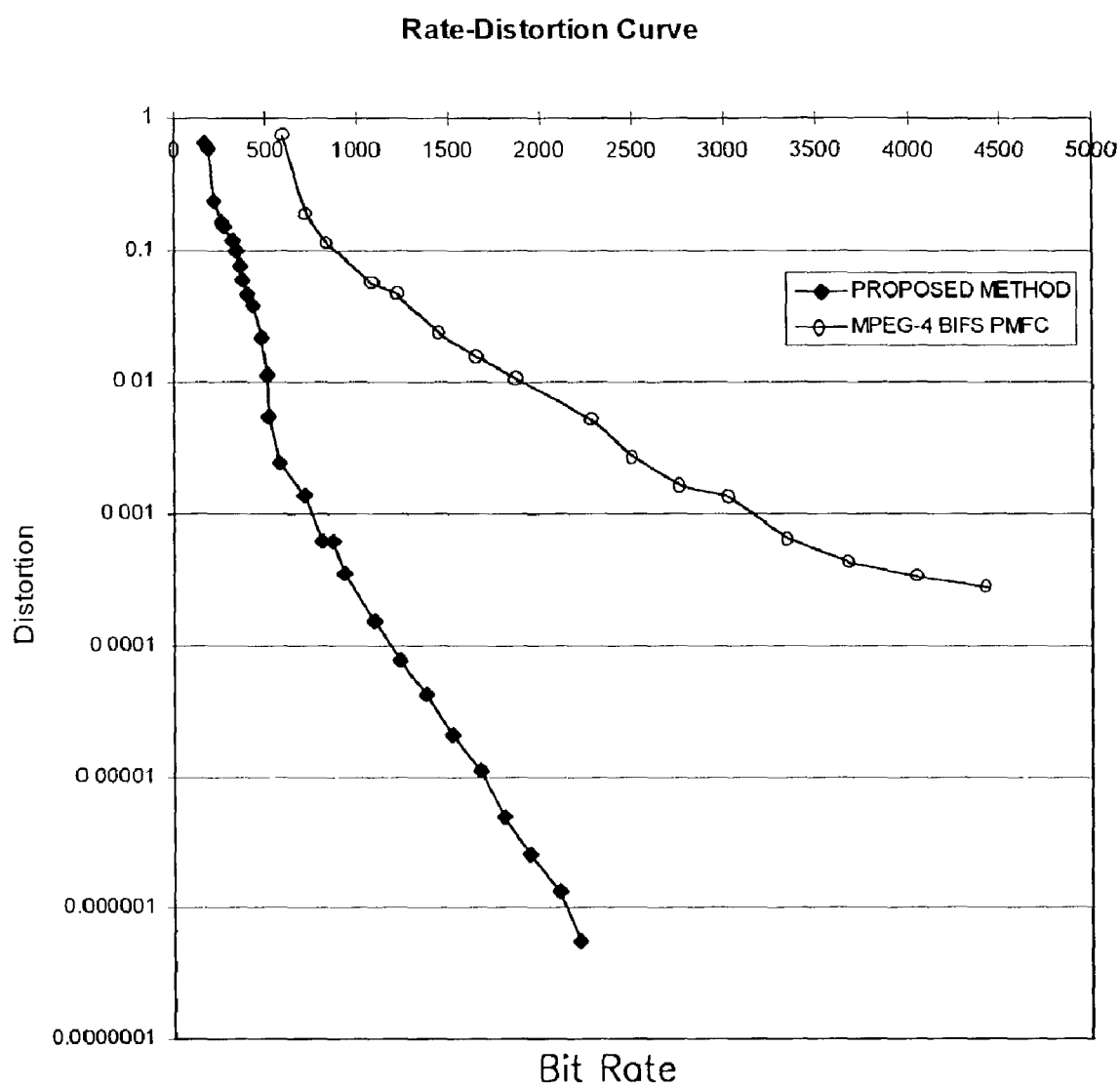

FIG. 20A is a rate-distortion curve showing the results of performance tests performed on the method for encoding and decoding key value data of a coordinate interpolator according to the present invention and a conventional MPEG-4 BIFS PMFC method. In particular, FIG. 20A shows the relationship between the degree of distortion and an encoded bit rate in the case of encoding 38 key value data of a coordinate interpolator. As shown in FIG. 20A, the method for encoding and decoding key value data of a coordinate interpolator has a higher efficiency than the conventional MPEG-4 BIFS PMFC method.

FIG. 20B includes three diagrams (a), (b), and (c). Specifically, in FIG. 20B, (a) shows animation data, (b) shows animation data which are encoded/decoded according to the present invention, and (c) shows animation data which are encoded/decoded following a conventional encoding/decoding method. As shown in FIG. 20B, the method for encoding and decoding key value data of a coordinate interpolator according to the present invention can provide an animation of higher quality, which is much closer to the original animation, than the conventional encoding/decoding method.

The method and the apparatus for encoding/decoding key value data of a coordinate interpolator so as to represent a keyframe-based animation according to the present invention have been described above with reference to the accompanying drawings, in which a preferred embodiment of the invention are shown. It is obvious to one skilled in the art that the DPCM operation, which is employed in the preferred embodiment of the present invention, is not limitedly applied only to key value data of a coordinate interpolator but also to vertex data including a plurality of components so as to represent a three-dimensional object.

Figure 21A:
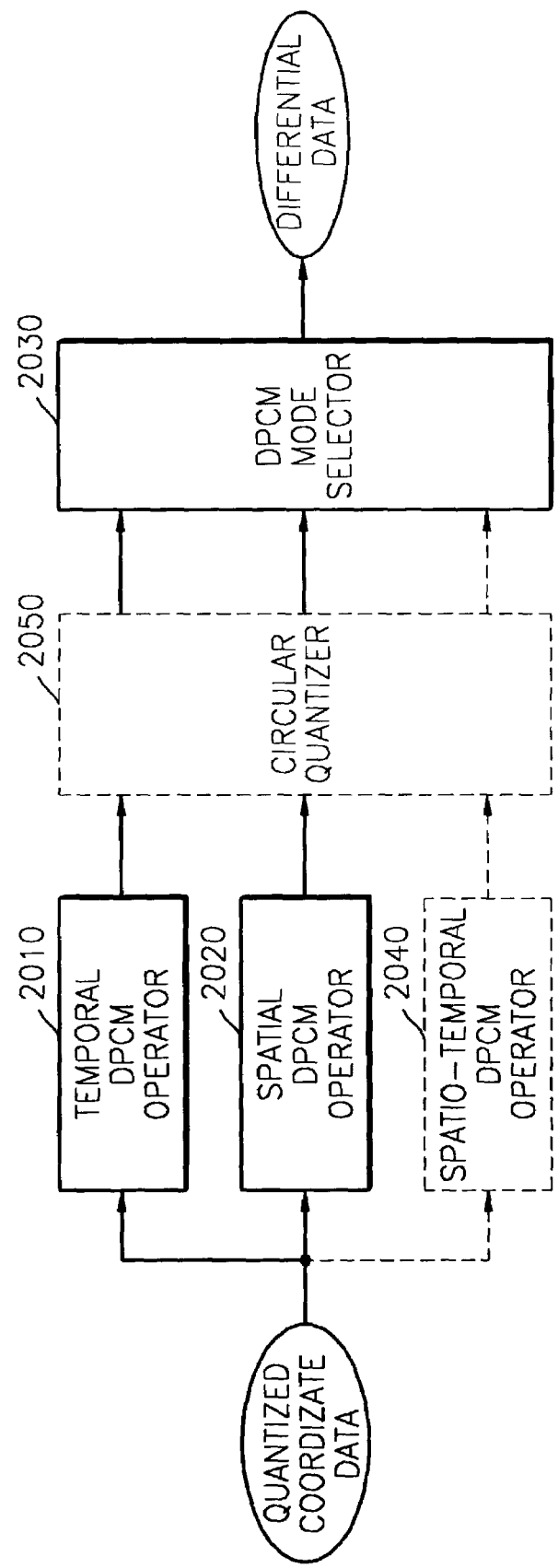
FIG. 21A is a block diagram of a DPCM operator according to a preferred embodiment of the present invention.

FIG. 21A is a block diagram of a DPCM operator according to the present invention. Referring to FIG. 21A, a DPCM operator according to the present invention includes a temporal DPCM operator 2010, which generates differential data between data of a vertex constituting a 3D object varying with the passage of time at a predetermined moment of time and data of the vertex at another predetermined moment of time, a spatial DPCM operator 2020, which generates differential data between data of a vertex and data of a reference vertex at a predetermined moment of time, and a DPCM mode selector 2030, which outputs the smaller ones between the differential data input from the temporal DPCM operator 2010 and the differential data input from the spatial DPCM operator 2020.

Preferably, the DPCM operator according to the present invention further includes a spatio-temporal DPCM operator 2040, which calculates differential data between differential data between a vertex and a reference vertex in a key frame and their corresponding differential data in another key frame by performing a temporal DPCM operation on the results of a spatial DPCM operation. Even in a case where the spatio-temporal DPCM operator 2040 is further provided, the DPCM mode selector 2030 still outputs the smallest ones among the differential data input from the temporal DPCM operator 2010, the differential data input from the spatial DPCM operator 2020, and the differential data input from the spatio-temporal DPCM operator 2040.

The operation of the elements of the DPCM operator according to the present invention is the same as that of the corresponding elements of the DPCM processor, which has been described above.

The DPCM operator according to the present invention receives quantized coordinate data of vertices constituting a 3D object from the outside.

The temporal DPCM operator 2010 calculates differential data between coordinate data of vertices when the vertices represent the current object and coordinate data of the vertices when the vertices were representing the previous object, using Equation (3).

The spatial DPCM operator 2020 calculates differential data between vertices, on which a DPCM operation has been performed, and currently input vertices, which exist on the same temporal axis as the DPCMed vertices, using Equation (5), selects a vertex having the smallest differential data as a reference vertex, and outputs the differential data.

The DPCM mode selector 2030 calculates the sizes of the differential data input from the temporal DPCM operator 2010 and the differential data input from the spatial DPCM operator 2020 and outputs the differential data having a smaller size together with DPCM operation information.

The spatio-temporal DPCM operator 2040, which may be further included in the DPCM operator according to a preferred embodiment of the present invention, performs the aforementioned spatial DPCM operation on quantized coordinate data of the 3D object using Equation (6) and performs the aforementioned temporal DPCM operation on the results of performing a spatial DPCM operation on a current vertex and the results of performing a spatial DPCM operation on a previous vertex.

A circular quantizer 2050, which is included in the DPCM operator according to a preferred embodiment of the present invention, reduces the range of differential data input thereinto using Equation (7).

Figure 21B:
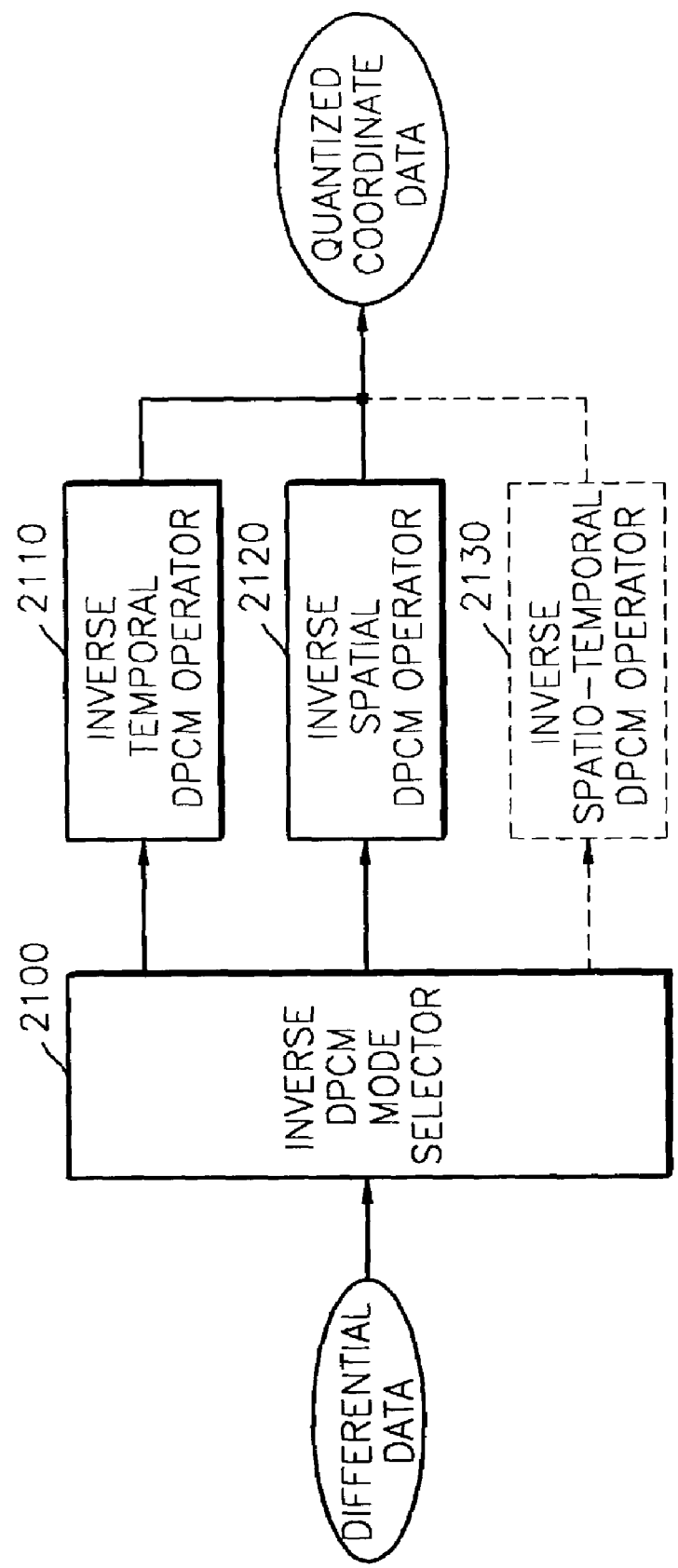
FIG. 21B is a block diagram of an inverse DPCM operator according to a preferred embodiment of the present invention.

FIG. 21B is a block diagram of an inverse DPCM operator, which converts differential data generated by the DPCM operator according to the present invention into quantized coordinate data.

An inverse DPCM operator according to the present invention includes an inverse temporal DPCM operator 2110, which performs an inverse DPCM operation on differential data between data of a vertex at a predetermined moment of time and data of the vertex at another predetermined moment of time, an inverse spatial DPCM operator 2120, which performs an inverse spatial DPCM operation on differential data between data of a vertex and data of a reference vertex at a predetermined moment of time, and an inverse DPCM mode selector 2100, which outputs differential data to the inverse temporal DPCM operator 2110 or the inverse spatial DPCM operator 2120, depending on the mode of a DPCM operation, which has been performed on the differential data.

Preferably, the inverse DPCM operator according to the present invention further includes an inverse spatio-temporal DPCM operator 2130, which performs an inverse spatio-temporal DPCM operation on the results of the current inverse spatial DPCM operation and the results of the previous inverse spatial DPCM operation.

The operation of the elements of the inverse DPCM operator according to the present invention is the same as that of the corresponding elements of the inverse DPCM processor, which has been described above.

Differential data to be retrieved into quantized coordinate data are input into the inverse DPCM mode selector 2100. Then, the inverse DPCM mode selector 2100 identifies what kind of DPCM has been performed on component data of each vertex included in the input differential data and outputs the component data of each of the vertices to the inverse temporal DPCM operator 2110, the inverse spatial DPCM operator 2120, and the inverse spatio-temporal DPCM operator 2130.

The inverse temporal DPCM operator 2110 performs an inverse temporal DPCM operation on the differential data input thereinto, following Equation (8), the inverse spatial DPCM operator 2120 performs an inverse spatial DPCM operation on the differential data input thereinto, following Equation (9), and the inverse spatio-temporal DPCM operator 2130 performs an inverse spatio-temporal DPCM operation on the differential data input thereinto, following Equation (10).

If the input differential data have been circular quantized, each of the DPCM operators 2110, 2120, and 2130 performs an inverse circular quantization operation on their respective inverse-DPCMed differential data using Equation (11) so as to extend the range of their respective inverse-DPCMed differential data.

The present invention can be realized as computer-readable codes written on a computer-readable recording medium. Here, the computer-readable recording medium includes any kind of recording medium which can be read by a computer system. For example, the computer-readable recording medium may include a ROM, a RAM, a CD-ROM, a magnetic tape, a floppy disk, an optical data storage, a carrier wave (transmission through the Internet), and the like. The computer-readable recording medium can be decentralized to computer systems connected over a network, and a computer can read the recording medium in a decentralized way.

The method and the apparatus for encoding key value data of a coordinate interpolator according to the present invention have a high encoding efficiency by encoding key value data of a coordinate interpolator in consideration of differential data between coordinate data of vertices in different keyframes as well as differential data between coordinate data of vertices of the coordinate interpolator.

In addition, the method and the apparatus for encoding key value data of a coordinate interpolator according to the present invention have an even higher encoding efficiency by representing differential data using symbols corresponding to the values of the differential data and position indexes for their respective symbols.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An apparatus for encoding key value data of a coordinate interpolator representing the position of each vertex of an object using coordinates of each of the vertices including x, y, and z components, the apparatus comprising:
    a quantizer which quantizes a coordinate interpolator input thereinto with predetermined quantization bits;
    a DPCM processor which performs a DPCM operation of a predetermined mode on each component of each vertex of the quantized coordinate interpolator and thus generates differential data based on the temporal variation of the coordinates of each of the vertices and differential data based on the spatial variation of the coordinates of each of the vertices;
    a dictionary encoder which generates symbols representing the differential data of each of the components of each of the vertices and the mode of a DPCM operation which has been performed on the differential data and position indexes indicating the positions of the symbols; and
    an entropy encoder which entropy-encodes the symbols and the position indexes.

2. The apparatus of claim 1, wherein the DPCM processor comprises:
    a DPCM operator which performs a temporal DPCM operation on each of the components of each of the vertices of the quantized coordinate interpolator so as to generate first differential data between a vertex in one keyframe and the vertex in another keyframe, performs a spatial DPCM operation on each of the components of each of the vertices of the quantized coordinate interpolator so as to generate second differential data between vertices in the same keyframe, and performs a spatio-temporal DPCM operation on each of the components of each of the vertices of the quantized coordinate interpolator so as to generate third differential data between vertices and keyframes;
    a circular quantizer which performs a circular quantization operation on the first through third differential data input from the DPCM operator so as to reduce their ranges; and
    a DPCM mode selector which selects one of the first through third differential data, which have been circular-quantized, depending on the number of bits required for encoding, and outputs the selected differential data.

3. The apparatus of claim 2, wherein the DPCM operator comprises:
    a temporal DPCM operator which calculates the differences between the coordinates of vertices in a current keyframe and the coordinates of the vertices in a previous keyframe;
    a spatial DPCM operator which calculates the differences between the coordinates of the vertices in the current keyframe and the coordinates of a reference vertex; and
    a spatio-temporal DPCM operator which calculates differential data between the differences between the coordinates of the vertices and the coordinates of their corresponding reference vertex in the previous keyframe and the differences between the coordinates of the vertices and the coordinates of their corresponding reference vertex in the current keyframe.

4. The apparatus of claim 3, wherein the reference vertex is a vertex, having the smallest number of bits required for encoding differential data between itself and current vertices subjected to a spatial DPCM operation, among vertices which have been DPCMed prior to the current vertices subjected to a spatial DPCM operation.

5. The apparatus of claim 2, wherein the circular quantizer generates differential data having a reduced size by performing a predetermined operation on the differential data of each of the components of each of the vertices and maximum and minimum values among them.

6. The apparatus of claim 5, wherein the circular quantizer generates circular-quantized differential data by adding a range value of the differential data of each of the components of each of the vertices to the differential data or subtracting the range value from the differential data depending on the signs of the differential data and the smaller ones between the differential data and the circular-quantized differential data are output.

7. The apparatus of claim 2, wherein the DPCM mode selector performs one of an SAD operation, a dispersion operation, and an entropy operation on the first through third differential data and selects among the first through third differential data having been through the corresponding operation the ones having the smallest size.

8. The apparatus of claim 1, wherein the dictionary encoder comprises:
a DPCM mode encoder which generates symbols representing combinations of DPCM modes which have been performed on data of each of the components of each of the vertices and position indexes indicating the positions of the symbols; and
an occurrence mode encoder which generates symbols corresponding to input differential data of each of the components of each of the vertices and position indexes indicating the positions of the symbols.

9. The apparatus of claim 8, wherein the occurrence mode encoder generates the symbols occurring in the input differential data and their respective position indexes in the form of a table.

10. The apparatus of claim 8, wherein the dictionary encoder further comprises:
an incremental mode encoder which generates a symbol flag indicating whether or not predetermined symbols exist in input differential data of each of the components of each of the vertices and position indexes indicating the positions of the symbols; and
a table size calculator which calculates the size of a first symbol table constituted by the symbols corresponding to the input differential data and the size of the symbol flag and outputs the input differential data of each of the components of each of the vertices, which are input from the DPCM mode encoder, to the occurrence mode encoder or the incremental mode encoder, depending on the sizes of the first symbol table and the symbol flag.

11. The apparatus of claim 10, wherein the incremental mode encoder generates a second symbol table, in which symbols to be encoded are arranged in the order from a symbol having the smallest absolute value to a symbol having the greatest absolute value, a symbol flag indicating whether or not the symbols corresponding to differential data input thereinto exist in the second symbol table, and position indexes indicating the positions of the symbols.

12. The apparatus of claim 10, wherein the table size calculator calculates the size of the first symbol table based on the number of symbols included in the input differential data and the number of bits required for encoding the symbols.

13. The apparatus of claim 10, wherein the table size calculator calculates the size of the symbol flag in an incremental mode based on the number of bits required for encoding the symbols included in the input differential data.

14. The apparatus of claim 1, wherein the entropy encoder entropy-encodes the most significant bit of differential data input thereinto using a first context and entropy-encodes other bits of the input differential data using a second context.

15. An apparatus for decoding a bitstream, into which key value data of a coordinate interpolator representing the position of each vertex of an object using coordinates of each of the vertices including x, y, and z components are encoded, the apparatus comprising:
an entropy decoder which generates data to be dictionary-decoded, including symbols of differential data, position indexes indicating the positions of the symbols, and a DPCM operation mode, by entropy-decoding an input bitstream
a dictionary decoder which generates differential data using the data to be dictionary-decoded;
an inverse DPCM processor which generates quantized data by retrieving differential data between keyframes and differential data between vertices, which are input from the dictionary decoder, following the DPCM operation mode; and
an inverse quantizer which generates retrieved key value data by inverse-quantizing the quantized data.

16. The apparatus of claim 15, wherein the dictionary decoder comprises:
a DPCM mode decoder which decodes information on the mode of a DPCM operation which has been performed on data of each component of each of the vertices; and
an occurrence mode decoder which generates differential data of each of the vertices based on symbols of input differential data to be dictionary-decoded and position indexes indicating the positions of the symbols.

17. The apparatus of claim 16, wherein the DPCM mode decoder retrieves the mode of a DPCM operation which has been performed on the data of each of the components of each of the vertices, based on symbols representing combinations of DPCM operation modes and position indexes indicating the positions of the symbols.

18. The apparatus of claim 16, wherein the dictionary decoder further comprises:
an incremental mode decoder which decodes symbols included in the differential data to be dictionary-decoded, based on a symbol flag indicating whether or not predetermined symbols exist in the differential data and generates differential data of each of the vertices based on position indexes indicating the positions of the symbols; and
a dictionary mode selector which reads a dictionary encoding mode from the bitstream and outputs the differential data to be dictionary-decoded to the occurrence mode decoder or the incremental mode decoder.

19. The apparatus of claim 15, wherein the inverse DPCM processor comprises:
an inverse temporal DPCM operator which performs an inverse DPCM operation on differential data between a vertex in one keyframe and the vertex in another keyframe;
an inverse spatial DPCM operator which performs an inverse DPCM operation on differential data between vertices in the same keyframe and their corresponding reference vertex; and an inverse DPCM mode selector which outputs differential data to the inverse temporal DPCM operator or the inverse spatial DPCM operator depending on the DPCM operation mode.

20. The apparatus of claim 19, wherein the inverse DPCM processor further comprises an inverse spatio-temporal DPCM operator which performs an inverse temporal DPCM operation on the results of performing an inverse spatial DPCM operation on a current keyframe and a previous keyframe,
wherein the inverse DPCM mode selector outputs the differential data to the inverse temporal DPCM operator, the inverse spatial DPCM operator, or the inverse spatio-temporal DPCM operator depending on the DPCM operation mode.

21. The apparatus of claim 20, wherein the inverse temporal DPCM operator, the inverse spatial DPCM operator, and the inverse spatio-temporal DPCM operator performs an inverse circular quantization operation on the input differential data and maximum and minimum values among them so as to extend their range.

22. A method for encoding key value data of a coordinate interpolator representing the position of each vertex of an object using coordinates of each of the vertices including x, y, and z components, the method comprising:
(a) quantizing key value data of a coordinate interpolator with predetermined quantization bits;
(b) performing a DPCM operation of a predetermined mode on each component of each vertex of the quantized coordinate interpolator and thus generating differential data based on the temporal variation of the coordinates of each of the vertices and differential data based on the spatial variation of the coordinates of each of the vertices;
(c) generating symbols representing the differential data of each of the components of each of the vertices and the mode of a DPCM operation which has been performed on the differential data and position indexes indicating the positions of the symbols; and
(d) entropy-encoding the symbols and the position indexes.

23. The method of claim 22, wherein step (b) comprises:
(b1) performing a temporal DPCM operation on each of the components of each of the vertices of the quantized coordinate interpolator so as to generate first differential data between a vertex in one keyframe and the vertex in another keyframe, performing a spatial DPCM operation on each of the components of each of the vertices of the quantized coordinate interpolator so as to generate second differential data between vertices in the same keyframe, and performing a spatlo-temporal DPCM operation on each of the components of each of the vertices of the quantized coordinate interpolator so as to generate third differential data between vertices and keyframes;
(b2) performing a circular quantization operation on the first through third differential data so as to reduce their ranges; and
(b3) selecting one of the first through third differential data, which have been circular-quantized, depending on the number of bits required for encoding.

24. The method of claim 23, wherein in step (b1), a temporal DPCM operation, in which the differences between the coordinates of vertices in a current keyframe and the coordinates of the vertices in a previous keyframe are calculated, a spatial DPCM operation, in which the differences between the coordinates of the vertices in the current keyframe and the coordinates of a reference vertex are calculated, and a spatio-temporal DPCM operation, in which differential data between the differences between the coordinates of the vertices in the previous keyframe and the coordinates of the reference vertex and the differences between the coordinates of the vertices in the current keyframe and the coordinates of their corresponding reference vertex are calculated, are performed.

25. The method of claim 24, wherein the reference vertex is a vertex, having the smallest number of bits required for encoding differential data between itself and current vertices subjected to a spatial DPCM operation, among vertices which have been DPCMed prior to the current vertices subjected to a spatial DPCM operation.

26. The method of claim 23, wherein in step (b2), differential data having a reduced size are generated by performing a predetermined operation on the differential data of each of the components of each of the vertices and maximum and minimum values among them.

27. The method of claim 26, wherein in step (b2), circular-quantized differential data are generated by adding a range value of the differential data of each of the components of each of the vertices to the differential data or subtracting the range value from the differential data depending on the signs of the differential data and the smaller ones between the differential data and the circular-quantized differential data are determined as circular-quantized differential data.

28. The method of claim 23, wherein in step (b3), one of an SAD operation, a dispersion operation, and an entropy operation is performed on the first through third differential data and then among the first through third differential data having been through the corresponding operation, the ones having the smallest size are selected.

29. A recording medium, on which the method of claim 23 is written in computer-readable program codes which can be processed in a computer.

30. The method of claim 22, wherein step (C) comprises:
(ci) generating symbols representing combinations of DPCM modes which have been performed on data of each of the components of each of the vertices and position indexes indicating the positions of the symbols; and
(c3) generating symbols corresponding to differential data of each of the components of each of the vertices and position indexes indicating the positions of the symbols.

31. The method of claim 30, wherein in step (c3), the symbols occurring in the input differential data and their respective position indexes are generated in the form of a table.

32. The method of claim 30, wherein step (c3) further comprises:
performing an incremental mode encoding operation in which a symbol flag indicating whether or not predetermined symbols exist in input differential data of each of the components of each of the vertices and position indexes indicating the positions of the symbols are generated,
wherein (c2) calculating the size of a first symbol table constituted by the symbols corresponding to the differential data and the size of the symbol flag and determining a dictionary encoding operation to be performed on the differential data of each of the components of each of the vertices is further included between step (ci) and step (c3).

33. The method of claim 32, wherein in the incremental mode encoding operation, a second symbol table, in which symbols to be encoded are arranged in the order from a symbol having the smallest absolute value to a symbol having the greatest absolute value, a symbol flag indicating whether or not the symbols corresponding to the differential data of each of the components of each of the vertices exist in the second symbol table, and position indexes indicating the positions of the symbols are generated.

34. The method of claim 32, wherein in step (c2), the size of the first symbol table is calculated based on the number of symbols included in the differential data of each of the components of each of the vertices and the number of bits required for encoding the symbols.

35. The method of claim 32, wherein in step (c2), the size of the symbol flag in an incremental mode is calculated based on the number of bits required for encoding the symbols included in the differential data of each of the components of each of the vertices.

36. A recording medium, on which the method of claim 32 is written in computer-readable program codes which can be processed in a computer.

37. A recording medium, on which the method of claim 30 is written in computer-readable program codes which can be processed in a computer.

38. The method of claim 22, wherein in step (d), the most significant bit of input differential data is entropy-encoded using a first context and other bits of the input differential data are entropy-encoded using a second context.

39. A recording medium, on which the method of claim 22 is written in computer-readable program codes which can be processed in a computer.

40. A method for decoding a bitstream, into which key value data of a coordinate interpolator representing the position of each vertex of an object using coordinates of each of the vertices including x, y, and z components are encoded, the method comprising:
(a) generating data to be dictionary-decoded, including symbols of differential data, position indexes indicating the positions of the symbols, and a DPCM operation mode, by entropy-decoding an input bitstream;
(b) generating differential data using the data to be dictionary-decoded by performing a dictionary decoding operation on the symbols of the differential data and the position indexes;
(c) generating quantized data by retrieving differential data between keyframes and differential data between vertices following the DPCM operation mode; and
(d) generating retrieved key value data by inverse-quantizing the quantized data.

41. The method of claim 40, wherein step (b) comprises:
(b1) decoding information on the mode of a DPCM operation which has been performed on each of the vertices; and
(b3) generating differential data of each of the vertices based on symbols of differential data to be dictionary-decoded and position indexes indicating the positions of the symbols.

42. The method of claim 41, wherein in step (b1), the mode of a DPCM operation which has been performed on the differential data of each of the components of each of the vertices is retrieved based on symbols representing combinations of DPCM operation modes and position indexes indicating the positions of the symbols.

43. The method of claim 41, wherein step (b3) further comprises performing an incremental mode decoding operation, in which symbols included in the differential data to be dictionary-decoded are decoded based on a symbol flag indicating whether or not predetermined symbols exist in the differential data and the differential data of each of the vertices are generated based on position indexes indicating the positions of the symbols,
wherein (b2) reading a dictionary encoding mode from the bitstream and determining a dictionary decoding operation to be performed on the data to be dictionary-decoded is further included between step (b1) and step (b3).

44. A recording medium, on which the method of claim 43 is written in computer-readable program codes which can be processed in a computer.

45. A recording medium, on which the method of claim 41 is written in computer-readable program codes which can be processed in a computer.

46. The method of claim 40, wherein in step (c), a predetermined inverse DPCM operation is performed on differential data following the DPCM operation mode, and the inverse DPCM operation comprises:
an inverse temporal DPCM operation, in which an inverse DPCM operation is performed on differential data between a vertex in one keyframe and the vertex in another keyframe so as to generate quantized data; and
an inverse spatial DPCM operation, in which an inverse DPCM operation is performed on differential data between vertices in the same keyframe and their corresponding reference vertex so as to generate quantized data.

47. The method of claim 46, wherein the DPCM operation further comprises an inverse spatio-temporal DPCM operation, in which an inverse DPCM operation is performed on the results of performing an inverse spatial DPCM operation on a current keyframe and a previous keyframe.

48. The method of claim 47, wherein in the inverse temporal DPCM operation, the inverse spatial DPCM operation, and the inverse spatio-temporal DPCM operation, an inverse circular quantization operation is per-formed on the input differential data and maximum and minimum values among them so as to extend their range.

49. A recording medium, on which the method of claim 40 is written in computer-readable program codes which can be processed in a computer.

* * * * *